US009541601B2

(12) United States Patent
Pagani

(10) Patent No.: US 9,541,601 B2
(45) Date of Patent: Jan. 10, 2017

(54) TESTING ARCHITECTURE OF CIRCUITS INTEGRATED ON A WAFER

(75) Inventor: Alberto Pagani, Nova Milanese (IT)

(73) Assignee: STMICROELECTRONICS S.R.L., Agrate Brianza (IT)

( * ) Notice: Subject to any disclaimer, the term of this patent is extended or adjusted under 35 U.S.C. 154(b) by 594 days.

(21) Appl. No.: 13/554,133

(22) Filed: Jul. 20, 2012

(65) Prior Publication Data

US 2013/0026466 A1    Jan. 31, 2013

(30) Foreign Application Priority Data

Jul. 28, 2011  (IT) ................................ MI2011A1418

(51) Int. Cl.
| | |
|---|---|
| H01L 23/58 | (2006.01) |
| H01L 29/10 | (2006.01) |
| G01R 31/28 | (2006.01) |
| H01L 21/66 | (2006.01) |
| H01L 23/00 | (2006.01) |

(52) U.S. Cl.
CPC ........... *G01R 31/2884* (2013.01); *H01L 22/32* (2013.01); *H01L 22/34* (2013.01); *H01L 23/585* (2013.01); *H01L 24/05* (2013.01); *H01L 2224/02166* (2013.01); *H01L 2224/05093* (2013.01); *H01L 2224/05554* (2013.01); *H01L 2924/12042* (2013.01)

(58) Field of Classification Search
CPC ...... H01L 22/34; H01L 22/32; H01L 2924/00; H01L 2924/0002
USPC ............................................. 257/48; 438/18
See application file for complete search history.

(56) References Cited

U.S. PATENT DOCUMENTS

| | | | | |
|---|---|---|---|---|
| 5,059,899 A | * | 10/1991 | Farnworth et al. | ............. 438/18 |
| 5,446,395 A | | 8/1995 | Goto | |
| 5,619,462 A | * | 4/1997 | McClure | ....................... 365/201 |
| 5,861,660 A | * | 1/1999 | McClure | ............... G01R 31/30 |
| | | | | 257/208 |
| 5,885,846 A | * | 3/1999 | Beffa | ..................... G01R 31/12 |
| | | | | 438/18 |
| 6,121,677 A | * | 9/2000 | Song | ....................... H01L 22/32 |
| | | | | 257/48 |
| 6,300,223 B1 | | 10/2001 | Chang et al. | |
| 6,365,443 B1 | * | 4/2002 | Hagiwara | ............... H01L 22/32 |
| | | | | 257/E21.662 |
| 6,427,222 B1 | * | 7/2002 | Shau | .............................. 438/18 |
| 6,492,716 B1 | | 12/2002 | Bothra et al. | |
| 7,224,176 B2 | | 5/2007 | Ryu et al. | |

(Continued)

OTHER PUBLICATIONS

Search report based on Italian application MI2011A001418, Ministero dello Sviluppo Economico, Munich, Mar. 21, 2012, 2 pages.

*Primary Examiner* — Lex Malsawma
*Assistant Examiner* — Eric Jones
(74) *Attorney, Agent, or Firm* — Gardere Wynne Sewell, LLP

(57) ABSTRACT

An embodiment of a testing architecture of integrated circuits on a wafer is described of the type including at least one first circuit of a structure TEG realized in a scribe line providing separation between at least one first and one second integrated circuit. The architecture includes at least one pad shared by a second circuit inside at least one of these first and second integrated circuit and the first circuit, as well as a switching circuitry coupled to the at least one pad and to these first and second circuits.

14 Claims, 23 Drawing Sheets

(56) References Cited

U.S. PATENT DOCUMENTS

| | | |
|---|---|---|
| 7,528,724 B2 | 5/2009 | Horch |
| 7,605,448 B2 | 10/2009 | Furusawa et al. |
| 2002/0145440 A1* | 10/2002 | Ohya et al. .................. 324/763 |
| 2004/0017217 A1* | 1/2004 | Ryu et al. .................... 324/763 |
| 2005/0073057 A1 | 4/2005 | Tiziani et al. |
| 2005/0218923 A1* | 10/2005 | Kutsuna ....................... 324/765 |
| 2008/0251788 A1* | 10/2008 | Maruyama ..................... 257/48 |
| 2010/0117678 A1 | 5/2010 | Nakabayashi |

\* cited by examiner

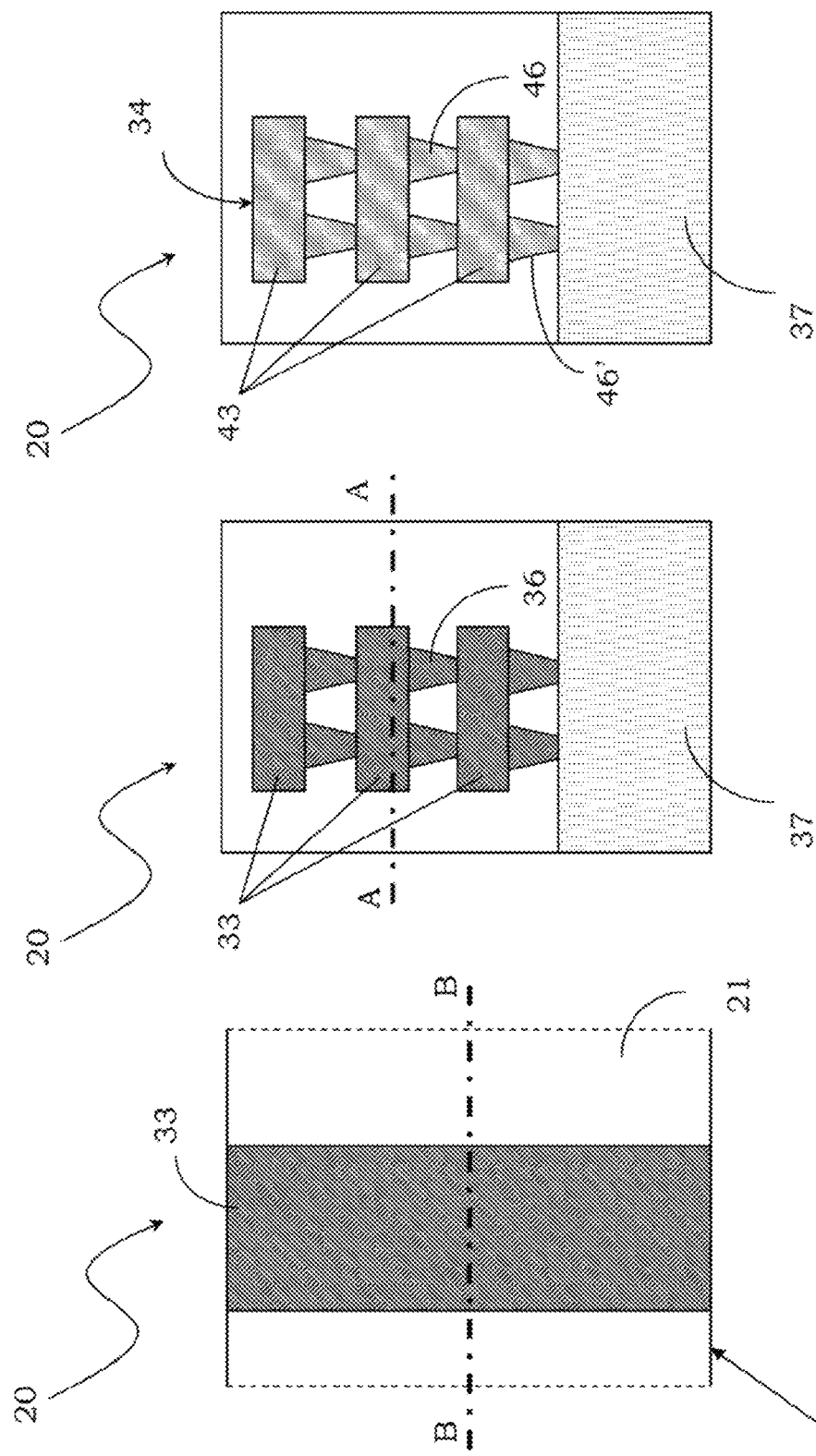

TESTING ARCHITECTURE OF CIRCUITS INTEGRATED ON A WAFER

PRIORITY CLAIM

The instant application claims priority to Italian Patent Application No. MI2011A001418, filed Jul. 28, 2011, which application is incorporated herein by reference in its entirety.

TECHNICAL FIELD

An embodiment relates to a testing architecture of integrated circuits on a wafer.

An embodiment particularly, but not exclusively, relates to an architecture of integrated circuits on a wafer of the type comprising structures TEG realized in scribe lines providing separation between these integrated circuits, and the following description is made with reference to this field of application for convenience of explanation only.

BACKGROUND

As it is well known, for the electric selection of devices carried out on wafer, i.e., the so called testing EWS (acronym of "Electrical-Wafer-Sorting"), it is typically necessary to electrically couple a tester or ATE (acronym of "Automated Test Equipment") that executes measures on a wafer whereon there are electronic components to be tested or selected or evaluated, in particular integrated circuits or chips. A terminal portion of the testing apparatus is schematically shown in FIG. 1A, globally indicated with 1.

The interface between the real tester ATE 1A and a wafer 6 includes a plurality of devices to be tested or selected, in particular chips 7 (also indicated as integrated circuits or IC, acronym of "Integrated Circuit") is a so called probe card 2, which is a board including in substance a PCB (acronym of "Printed Circuit Board") and a probe head 3 that in turn includes different e.g., hundreds or thousands) of probes 4 that electrically couple the tester ATE 1A to all, or almost all, the contact pads 8 of a chip 7 to be tested, as shown in greater detail in FIG. 1B. In particular, each end portion or tip 9 of the probes 4 comes into contact with a contact pad 8 of the chip 7 during a testing phase.

In general, the wafer 6 groups a plurality of chips 7 to be tested, and during the testing steps it is put on a support called chuck 5, shown in the portion of the testing apparatus 1, and belonging to an apparatus also called prober (not shown in the figure), this support 5 being thus also indicated as a prober chuck.

The number of contact pads 8 necessary for a determined testing may be smaller or equal to the total number of contact pads 8 of the chip 7 to be tested.

One may test a similar way even if the chips 7 have contact bumps instead of contact pads 8.

Before each chip 7 is encapsulated in a corresponding package, it is known to execute the testing of the chip 7 itself, being still on the wafer 6, using the probes 4 that are directly coupled to the contact pads 8, and that thus execute the so called probing of the contact pad 8 they come in contact with.

After the testing, the wafer 6 is cut and the chips 7 that have been tested and are determined to be properly operating are assembled in their package, ready for further process steps, also including final test steps of the chips 7 in the package wherein they have been assembled.

To this purpose, on the wafer 6, between one chip 7 and another, an area called a scribe line SL is created within which a saw or a laser will pass during the cutting or singulation operation, necessary for separating the various devices being on the wafer for executing the various assembling and encapsulating or packaging steps of the same devices, as schematically shown in FIG. 2. In particular, in the schematic enlargement indicated by way of illustration in FIG. 2, a group of four chips 7, indicated as IC A, IC B, IC C and IC D, are separated by a first scribe line SL1, in particular horizontal according to the local reference of the figure, and a second scribe line SL2, in particular vertical, in the local reference of the figure.

Moreover, as shown in this figure, in the scribe lines (in particular in the first scribe line SL1) elementary structures are sometimes introduced, usually indicated as structures TEG (acronym of "Test Element Group"), these structures being used, for example, for the testing of some process parameters, that are in general measured before the electric wafer test EWS.

The structures TEG are in general coupled to pads being also in the scribe line SL and normally distinct with respect to the pads of the chip 7.

It is also known from U.S. Pat. No. 7,224,176, which is incorporated by reference, to Samsung to realize a wafer wherein the pads of the structures TEG coincide with the pads of the chips.

In practice, however, such a realization has problems in the operation since the structures TEG thus coupled suffer from the effect of the circuits being in the chips and from their faults. In particular, there may be problems tied to leakage currents in the chip or in the pads shared by chips and structures TEG that may be, for example, in short circuit with the ground.

Furthermore, in the case in which the structures TEG are used for understanding the manufacturing process problems of the wafer, it may be difficult to execute reliable and accurate measures by using pads shared by chips and structures TEG, due to the presence of defects in the chip itself on the wafer due to the process problems.

The circuits realized on the chips also introduce parasitics (e.g., resistances, capacities, non linear effects . . . ) that may jeopardize the accuracy of the measure on the structures TEG.

Furthermore, each chip 7 is surrounded by a conventional protection structure, the so called seal ring 7A.

More in particular, the seal ring 7A has the aim of sealing the respective chip 7 and mechanically strengthening it for ensuring the reliability and protection against the mechanical effort exercised by the saw during the cutting or singulation of the chip 7 from the wafer 6.

The seal ring 7A is usually placed between an area where the contact pads of the chip itself are placed, normally indicated as pad ring, and the scribe line confining with the chip itself.

Usually, the seal ring 7A includes a plurality of metal layers and of vias that couple them so as to realize a structure able to block also ions and polluting substances (such as for example humidity) that could jeopardize the good operation of the chip 7 after the singulation.

Different implementations are known for the realization of a seal ring of an integrated electronic device or chip. For example, in U.S. Pat. No. 6,300,223, which is incorporated by reference, a structure of a seal ring is described wherein dielectric layers and metal layers are alternated, the structure being also provided with a trench for reducing the mechanical stresses at the singulation of the chips from the wafer. Other structures suitable for realizing a seal ring are also known from U.S. Pat. No. 7,605,448. and U.S. Pat. No. 6,492,716, which are incorporated by reference.

For avoiding the problems of radiofrequency interferences able to jeopardize the operation of the chip, it is also known to suitably cut the seal ring in those points whereat substrate disturbances could be injected coming from internal circuits of the chip itself (such as power amplifiers, clock signals generators, processing circuits of input/output digital signals, etc).

The growing requests for electronic applications able to sustain higher and higher temperatures have also brought the introduction of new materials for realizing the pads and the couplings between the pads and the package of the chips so as to ensure a good electric coupling.

Some of these materials are also used for strengthening the pad itself. For example, it is possible to use surface covering layers realized in materials with greater hardness with respect to those traditionally used, such as for example aluminum, avoiding in this way breaking the possible microelectronic structures being under the pad.

A pad made of some layers of different materials able to improve the strength of the pad as a whole is described for example in US Patent Application No. 2005/0073057, which is incorporated by reference.

In this case, a generic pad 8 of a chip includes for example an upper metal layer corresponding to a final metal layer of the chip wherein this pad is realized and made of a generic material A (for example copper). According to the teaching of US2005/0073057, above the material A a first material B having a high hardness (for example nickel or an alloy thereof) and a second material C (for example palladium or an alloy thereof) are placed. Possibly, another layer of a further material D (for example gold or an alloy thereof) may be realized above the second material C, the pad being also surrounded by a passivation layer E, as schematically shown in FIG. 3 of the present patent application.

Between the materials A and B, as well as between the materials B and C and between the materials C and D, there may possibly be also layers of still other materials, created one above the other using known techniques in the field of the manufacturing of integrated circuits.

For example, one of the known techniques for the growth of these materials is the so called electroless process, the considerations that follow being however valid also for other types of processes.

In particular, further to the growth and/or deposition of the materials according to the process used, these same materials will be present on all the pads 8 of the wafer 6, and in particular on the pads of the chips 7 but also on the pads of the structures TEG.

After the testing of these structures TEG and of the chips 7 of the wafer, the wafer itself is cut and the working devices are assembled in a package.

The presence of the hard materials on the pads of the structures TEG makes it however difficult to execute the cut or singulation of the chips 7 from the wafer 6, executed as already said by means of a diamond saw, for example. In this case in fact, the saw may damage the edge of the chip 7 exactly because of the presence of hard materials on the pads of the structures TEG, thus creating chippings.

Solutions currently known do not allow then to execute measures in an accurate and reliable way of the structures TEG. In particular, these measures are not reliable in the case of shared pads by the structures TEG and the chips 7 that surround them. Further problems introduced by the presence of the seal ring, that requires the use of complex structures aimed at crossing it, that contribute to the increase of the final costs of the chips thus obtained. Finally, the presence of hard materials aimed at strengthening the structures of the pad also on the surface of the pads of the structures TEG introduces problems of chipping of the chip at their singulation from the wafer wherein they have been realized.

SUMMARY

An embodiment is an architecture of a semiconductor wafer including a plurality of chips separated by suitable scribe lines wherein structures TEG are realized, this architecture having such structural and functional characteristics as to allow to overcome the limits and the drawbacks still affecting the architectures realized according to the prior art.

An embodiment is realizing at least one testing architecture provided with a switching circuitry for acting on the circuits inside the integrated circuits on the wafer, but also on those of the structures TEG realized in the scribe lines.

An embodiment is a testing architecture of integrated circuits on a wafer of the type including at least one first circuit of a structure TEG realized in a scribe line providing separation between at least one first and one second integrated circuit characterized in that it includes at least one pad shared by a second circuit inside at least one of these first and second integrated circuits and by the first circuit, as well as a switching circuitry coupled to the at least one pad and to these first and second circuits.

More in particular, an embodiment includes the following supplementary and optional characteristics, taken alone or in combination, when needed.

According to an embodiment, the at least one pad may belong to a group of pads arranged in at least one of these first and second integrated circuit in correspondence with the scribe line.

According to another embodiment, the at least one pad may be a coupling pad between the first and second circuits and the switching circuitry may include at least one first and one second switch that couple the coupling pad with the first and second circuits respectively.

According to yet another embodiment, the testing architecture may further include at least one enable pad coupled to the switching circuitry.

In particular, the enable pad may be shared by the first and second integrated circuits and coupled to control terminals of the first and second switches.

Furthermore, the testing architecture may include respective enable pads in the first and second integrated circuits, coupled to control terminals of the first and second switches.

According to another embodiment, the testing architecture may include at least one dedicated pad coupled only to one of these first and second circuits.

Moreover, the switching circuitry may further included couplings of the fuse link type with the first circuit.

According to an embodiment, the switching circuitry may also include test circuits associated with at least one of these first and second circuits.

In particular, these test circuits may be of the BIST type (Built-In Self Test).

According to another embodiment, the testing architecture may further include a support circuit realized in at least one of the integrated circuits and coupled to the switching circuitry.

Suitably, the switching circuitry may include at least one further switch coupled to the support circuitry and to the first circuit.

In particular, this further switch may have a control terminal coupled to the at least one enable pad.

According to yet another embodiment, the testing architecture may further include at least one controller realized in the scribe line and coupled to the first circuit, this controller being suitable for supervising the testing of the first circuit.

In this case, the switching circuitry may include at least one further switch coupled between the controller and at least one further coupling pad of the first and second integrated circuits.

In particular, this further switch may have a control terminal coupled to the at least one enable pad.

According to an embodiment, the testing architecture for an integrated circuit provided with a seal ring realized by means of a conductive structure that is formed by a plurality of conductive lines and extends in a peripheral portion of the integrated circuit next to the scribe line on different planes starting from a substrate, is characterized in that it is reinforced by at least one pillar structure formed by the coupling of further conductive lines to realize the at least one pad.

According to this embodiment, the at least one pillar structure may include conductive couplings that develop perpendicularly to the planes and couple the further conductive lines arranged on different but contiguous planes.

In particular, the pillar structure may include at least one upper conductive line emerging from the integrated circuit through an opening.

According to an embodiment, the seal ring may include a linear element that crosses a structure of the at least one pad, passing near the at least one pillar structure below the upper conductive line.

Moreover, the integrated circuit may include suitably doped areas realized in the substrate so as to extend substantially in correspondence with the at least one pillar structure.

In particular, these areas may be suitably doped in a complementary way with respect to the substrate so as to form inversely biased junctions PN.

According to another embodiment, the testing architecture may include a coupling line that extends in the scribe line and/or at least one line of coupling to the circuitry realized in the integrated circuit.

According to yet another embodiment, the testing architecture may include at least one conductive via of coupling of a metal line of a structure TEG with the conductive line that extends in the scribe line, this conductive via realizing a fragile-making point at a successive singulation step of the integrated circuit from the wafer wherein it is realized.

In particular, the pad and the coupling lines may be insulated from the seal ring, this pad having a substantially ring-like shape that surrounds the seal ring.

Furthermore, according to an embodiment, the testing architecture may include fuse links developed in parallel to the seal ring.

According to another embodiment, the integrated circuit may include at least one first well realized in the substrate and doped in an opposite way with respect to it, the coupling lines being coupled to the well and the seal ring being insulated therefrom.

Finally, the integrated circuit may include at least one second well realized in the substrate and doped in a similar way to it, the seal ring being coupled to the second well.

BRIEF DESCRIPTION OF THE DRAWINGS

Characteristics and advantages of the testing architecture for integrated circuits on wafer will be apparent from the following description of embodiments thereof given by way of indicative and non-limiting example with reference to the annexed drawings.

In these drawings:

FIGS. 13A-13B schematically show portions of a conventional seal ring;

FIG. 13C schematically shows the section of an embodiment of a pillar included in an embodiment of the architecture;

DETAILED DESCRIPTION

Figures 1A, 1B:
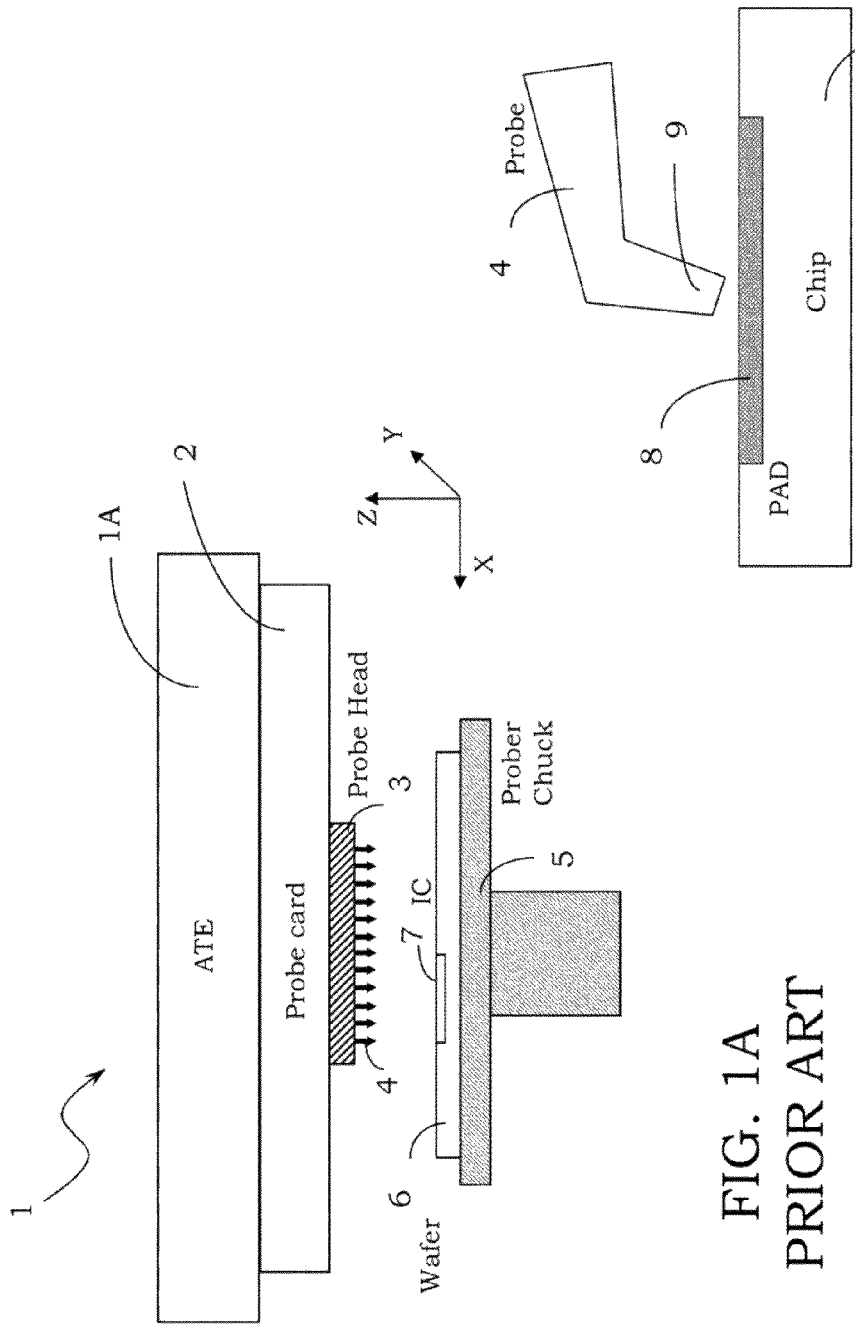
FIGS. 1A and 1B respectively show, schematically and in greater detail, a conventional terminal portion of a testing apparatus of integrated circuits on wafer.
Figure 2:
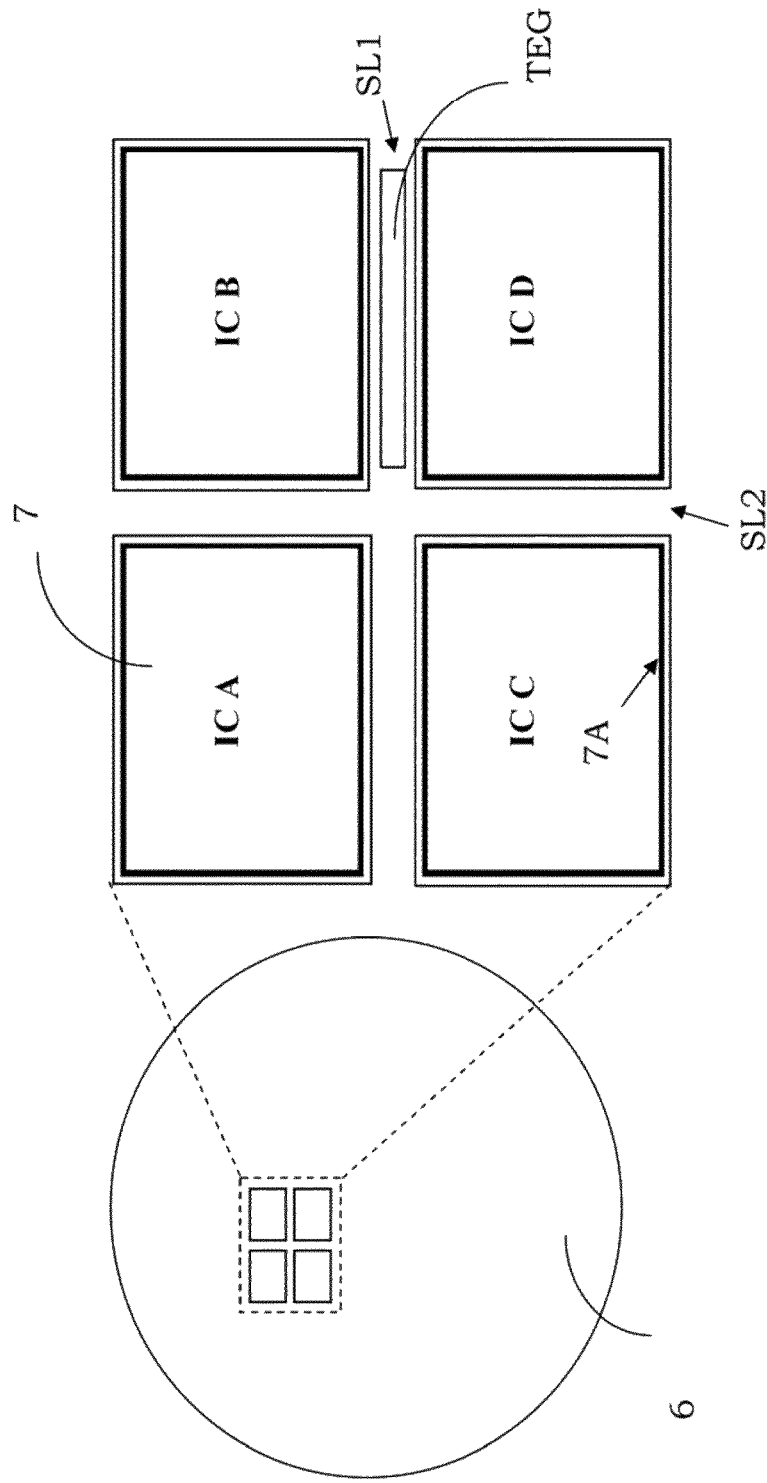
FIG. 2 schematically shows a conventional wafer including a plurality of integrated circuits (chips) separated by scribe lines.
Figure 3:
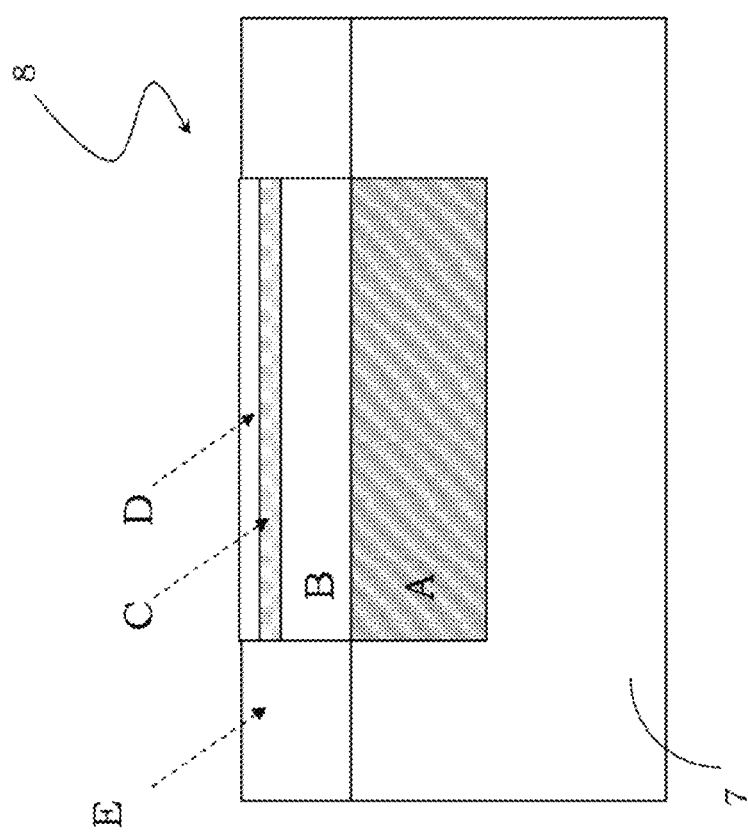
FIG. 3 schematically shows a conventional multilayer pad.
Figure 4:
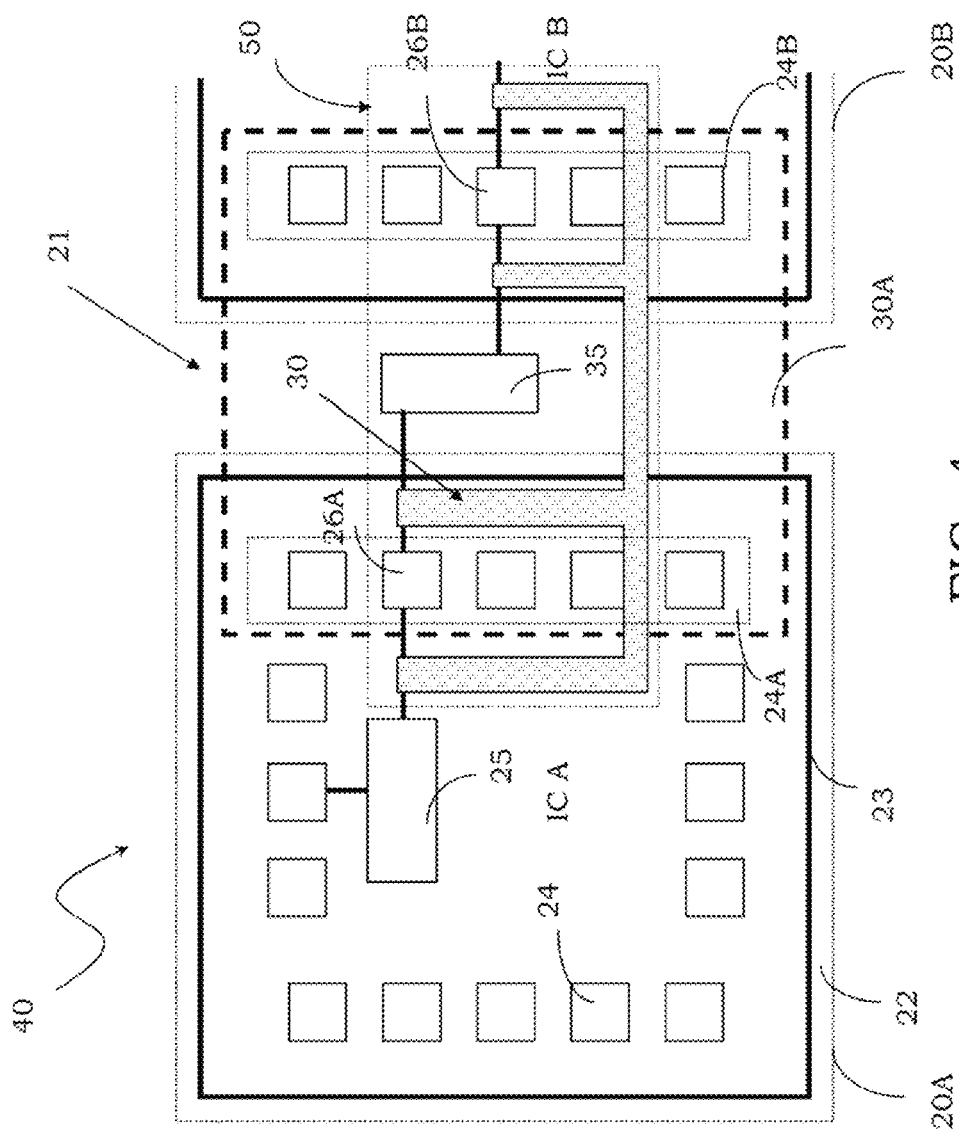
FIG. 4 schematically shows an embodiment of a testing architecture of integrated circuits on wafer.

With reference to these figures, and in particular to FIG. 4, a wafer 40 of semiconductor material is globally and schematically shown, in particular a portion thereof including at least one first and one second integrated circuit, 20A and 20B, separated by a scribe line 21.

It is to be noted that the figures are not drawn to scale, but are instead drawn so as to emphasize features of embodiments. Moreover, in the figures, the different pieces are shown in a schematic way, and their shape may vary according to the desired application.

Furthermore, elements or measures described for convenience of illustration with reference to an embodiment are not to be intended as limited thereto, the different characteristics, structures and/or elements having the possibility to be indifferently used in combination with the different embodiments described.

Each integrated circuit, 20A or 20B, includes a plurality of pads 24, usually arranged along its perimeter, as well as further inner circuitry that can be suitably tested. By way of simplicity, FIG. 4 indicates only a generic circuit, in particular inside the first integrated circuit 20A, hereafter indicated as circuit IC 25. Each integrated circuit is also enclosed by a seal ring 23 realized in its peripheral portion 22.

The wafer 40 also includes at least one structure TEG, in particular including at least one circuit realized in the scribe line 21, hereafter indicated as circuit TEG 35.

According to an embodiment, on the wafer 40 a testing architecture is realized, globally indicated with 50. In particular, this testing architecture 50 includes at least the structures TEG, as well as switching circuitry 30 realized in the integrated circuits 20A and 20B and in the scribe line 21 and including electronic switches, for example, including at least one transistor MOS. More in particular, the integrated circuits 20A and 20B include respective pads, indicated with 26A and 26B respectively, these pads being common between the circuit IC 25 and the circuit TEG 35, the switching circuitry 30 being coupled to the circuit IC 25, to the circuit TEG 35, and to the common pads, 26A and 26B. Although not shown in the figure for sake of simplicity, also the second integrated circuit 20B can include inner circuitry suitably coupled, by means of the switching circuitry 30, to the common pad 26B and thus to the circuit TEG 35.

It is to be noted how the group of the pads arranged along the scribe line 21 that separates the integrated circuits 20A and 20B, these groups of pads being indicated with 24A and 24B, respectively, as well as the circuit TEG 35 form an integrated circuit including the structures TEG, hereafter indicated as integrated circuit TEG 30A.

In substance, the testing architecture 50, thanks to the switching circuitry 30, is able to enable the integrated circuit TEG 30A or an integrated circuit 20A, 20B or both if tests are to be executed that involve both the integrated circuits, in a simple and flexible way.

Figure 5:
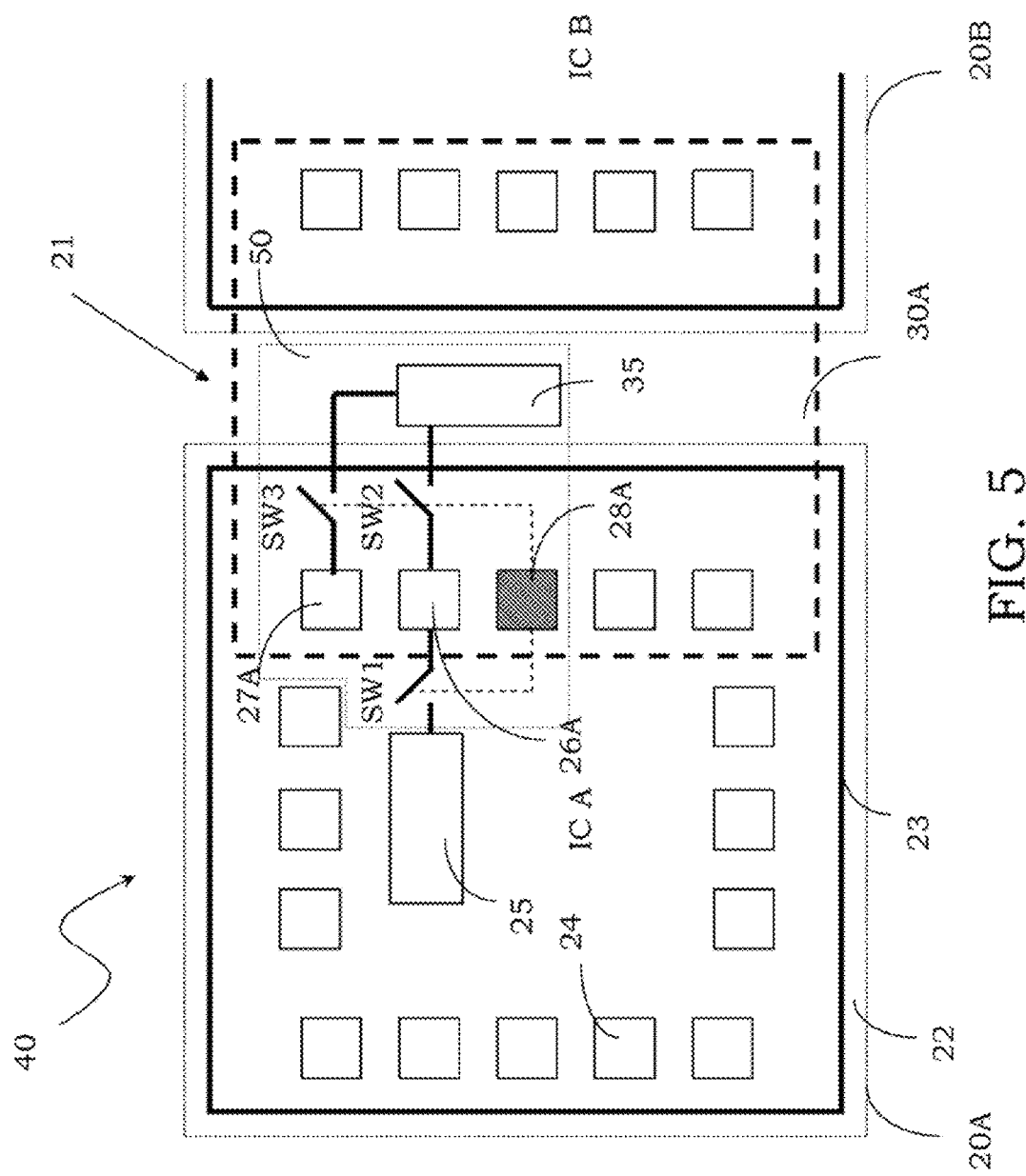
FIG. 5 schematically shows an embodiment of the architecture of FIG. 4.

More in particular, as schematically shown in FIG. 5, according to an embodiment, the testing architecture 50 includes a first and a second pad, 26A and 27A, as well as an enable pad 28A realized in the first integrated circuit 20A, in particular in correspondence with the group of pads 24A that faces the scribe line 21, as well as switching circuitry 30 formed by a first, a second, and a third switch, SW1, SW2, and SW3.

As shown in this figure, the first switch SW1 couples the circuit IC 25 to the first pad 26A, the second switch SW2 couples the first pad 26A to the circuit TEG 35, and the third switch SW3 couples the circuit TEG 35 to the second pad 27A. Suitably, the three switches, SW1, SW2 and SW3, have control terminals coupled to the enable pad 28A.

In this way, an enable signal applied to the enable pad 28A of the testing architecture 50 is able to select the test enabling of the circuit IC 25 or of the circuit TEG 35, this enable signal opening and/or closing the switches SW1, SW2 and SW3 of the switching circuitry 30 according to the desired test condition.

According to an embodiment, a pad, in particular the second pad 27A, could be dedicated to the integrated circuit TEG 30A only, the same being not used for the integrated circuit, for example, the first integrated circuit 20A, as shown in FIG. 5.

These dedicated pads may be used, for example, for measures having particular requisites, like, for example, measures of the breakdown voltage of the structures TEG that normally require voltages of some tens of volts.

Figure 6:
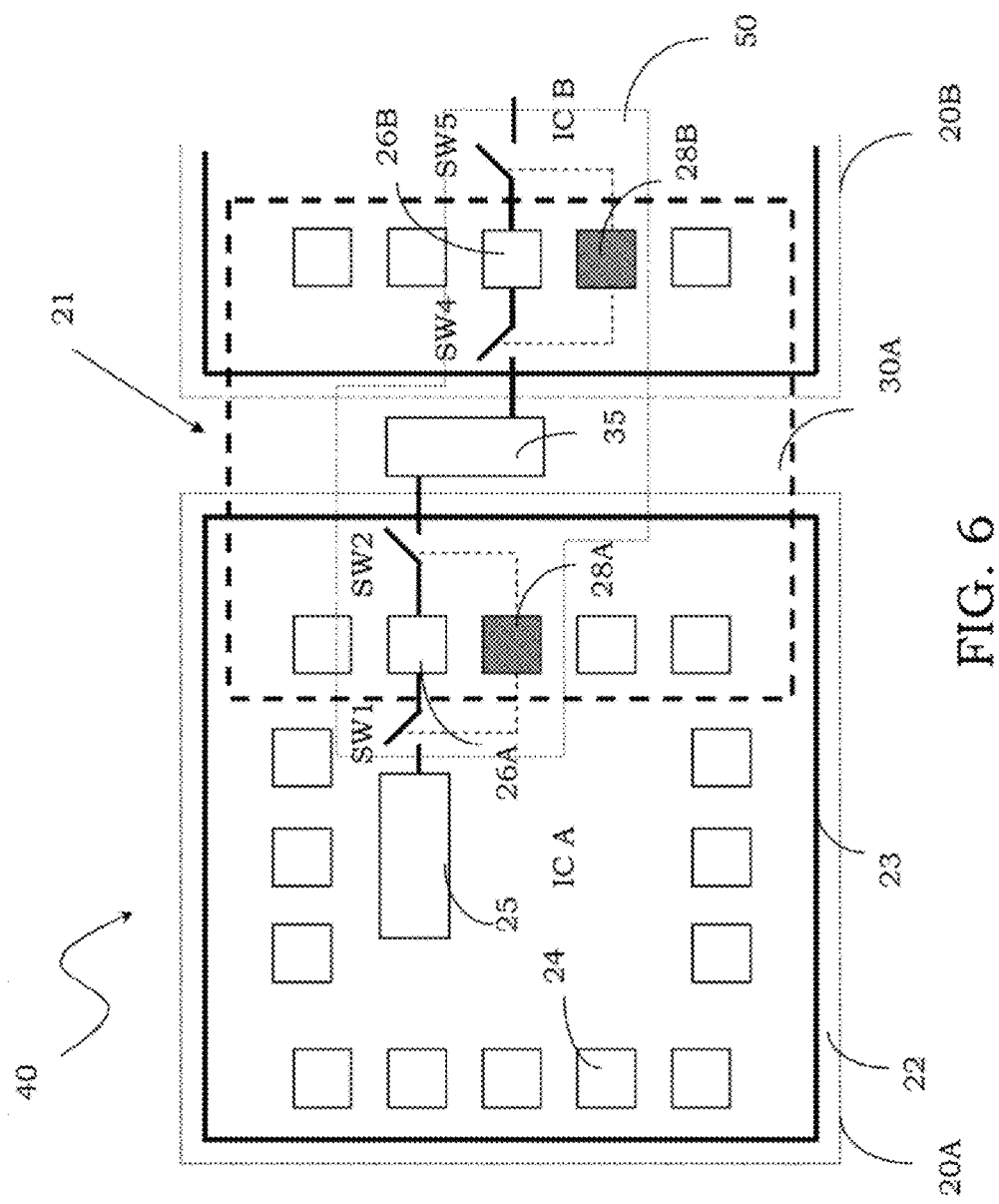
FIGS. 6-8 schematically show other embodiments of the architecture of FIG. 4.

According to an alternative embodiment, the testing architecture 50 may include an enable pad for each integrated circuit 20A, 20B, in particular a first pad 26B and an enable pad 28B also in the second integrated circuit 20B, as schematically shown in FIG. 6.

In this case, the testing architecture 50 includes the first pad 26A realized in the first integrated circuit 20A and the switching circuitry 30 includes the first and second switches SW1 and SW2 that couple this first pad 26A to the circuit IC 25 and the circuit TEG 35, suitably driven thanks to the coupling of their control terminals to the enable pad 28A. Similarly, the testing architecture 50 includes a further coupling pad 26B realized in the second integrated circuit 20B, and the switching circuitry 30 includes a fourth and a fifth switch, SW4 and SW5, that couple this further pad 26B to a further circuit IC (not shown) and to the circuit TEG 35, also the fourth and fifth switches, SW4 and SW5, being suitably driven thanks to the coupling of their control terminals to a further enable pad 28B of the testing architecture 50.

Figure 7:
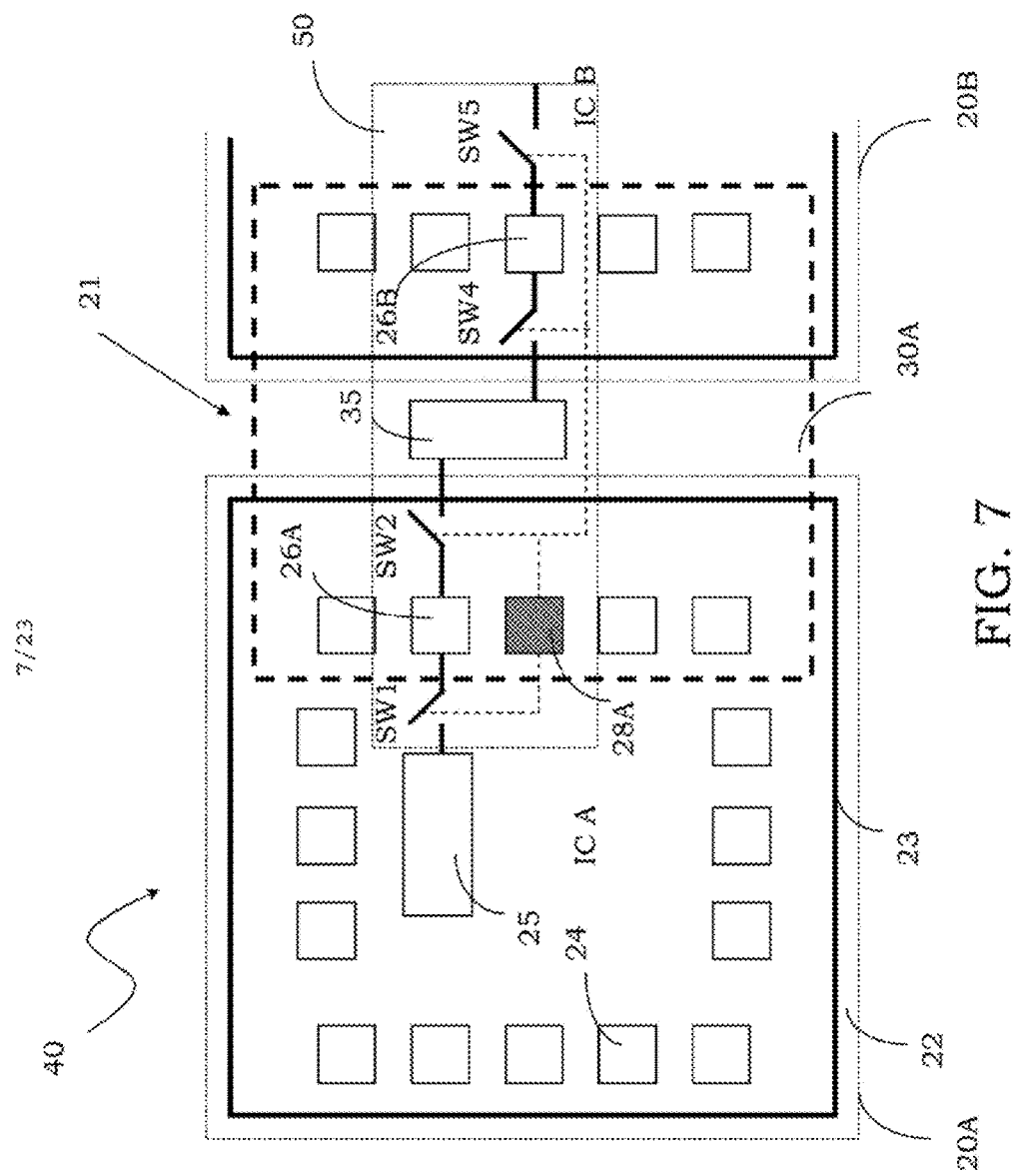

In a similar way, according to a further embodiment, the testing architecture 50 may include only one enable pad, for example the enable pad 28A realized in the first integrated circuit 20A, for enabling more than one integrated circuit. In this case, as schematically shown in FIG. 7, the testing architecture 50 includes the first pad 26A in the first integrated circuit 20A, and the switching circuitry 30 includes the first and second switches SW1 and SW2 that couple this first pad 26A to the circuit IC 25 and the circuit TEG 35, suitably driven thanks to the coupling of their control terminals to the enable pad 28A. The testing architecture 50 includes a further coupling pad 26B in the second integrated circuit 20B, and the switching circuitry 30 includes a fourth and a fifth switch, SW4 and SW5, that couple this further pad 26B to a further circuit IC (not shown) and to the circuit TEG 35, suitably driven thanks to the coupling of their control terminals still to the enable pad 28A.

Figure 8:
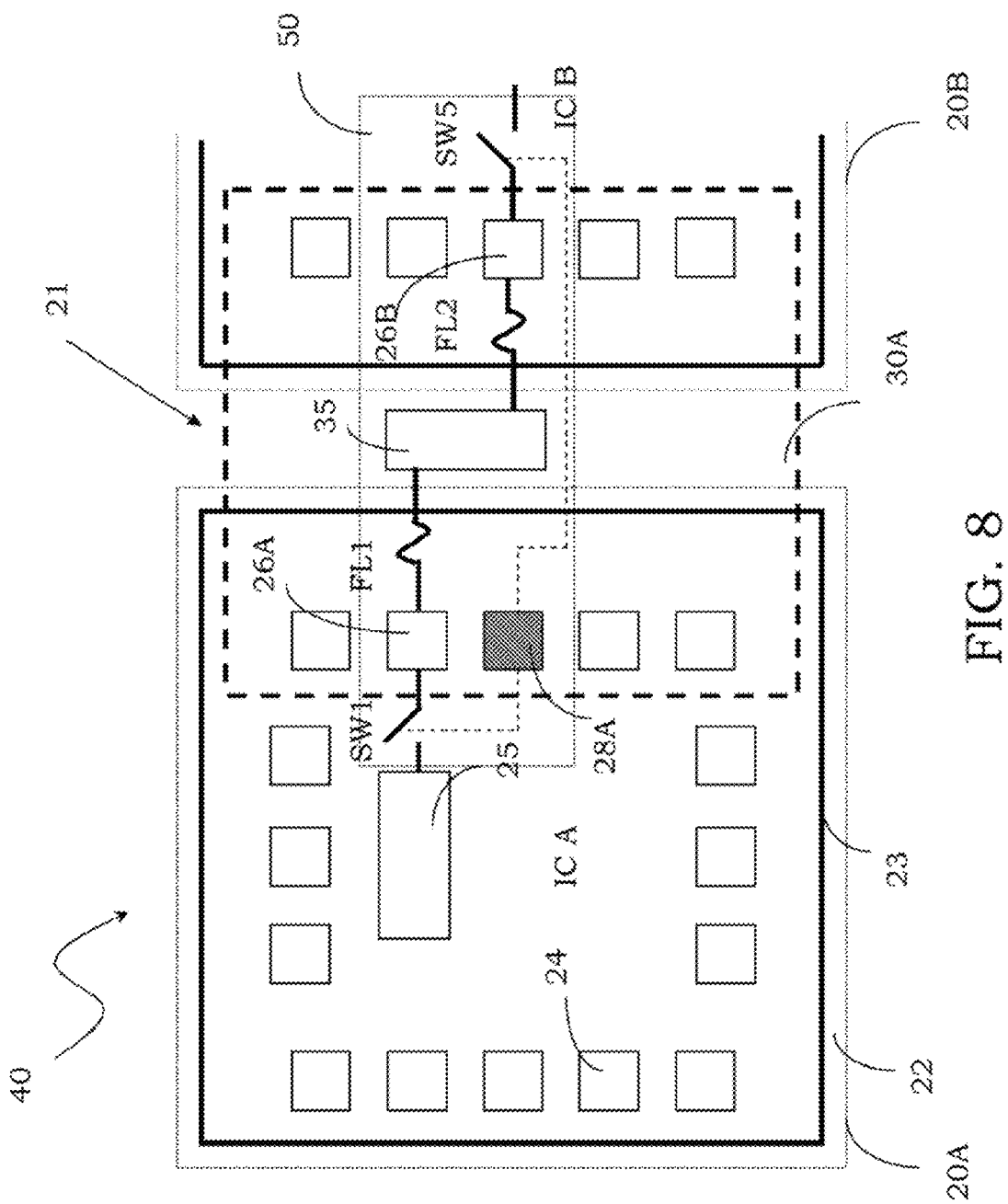

According to a further embodiment, the switching circuitry 30 of the testing architecture 50 also includes couplings of the fuse-link type. In particular, as schematically shown in FIG. 8, the testing architecture 50 includes in this case the first pad 26A realized in the first integrated circuit 20A and coupled to the circuit IC 25 by means of the first switch SW1 of the switching circuitry 30, that also includes a first fuse link FL1 that couples the first pad 26A to the circuit TEG 35. Similarly, the testing architecture 50 includes a further pad 26B realized in the second integrated circuit 20B and coupled by means of a switch SW5 of the switching circuitry 30 to a further circuit IC (not shown); the switching circuitry 30 also includes a second fuse link FL2 that couples the further pad 26B to the circuit TEG 35.

According to these embodiments, the tests on the circuits IC and on the circuits TEG are executed separately. In particular, if the test of the circuit TEG 35 is executed first and then the test of the circuit IC 25 is executed, it is possible to disable the coupling to the integrated circuits 20A and 20B by means of the enable pad 28A, to execute the measures on the circuit TEG 35, and then to execute the test on the circuit IC 25 eliminating the coupling between the pads, 26A and 26B, and the circuit TEG 35 by means of the fuse links FL1 and FL2.

It is to be noted that, in this case, by burning the fuse links FL1 and FL2 there will be also the possibility to avoid leakage currents after the cut or singulation of the wafer 40.

Figure 9:
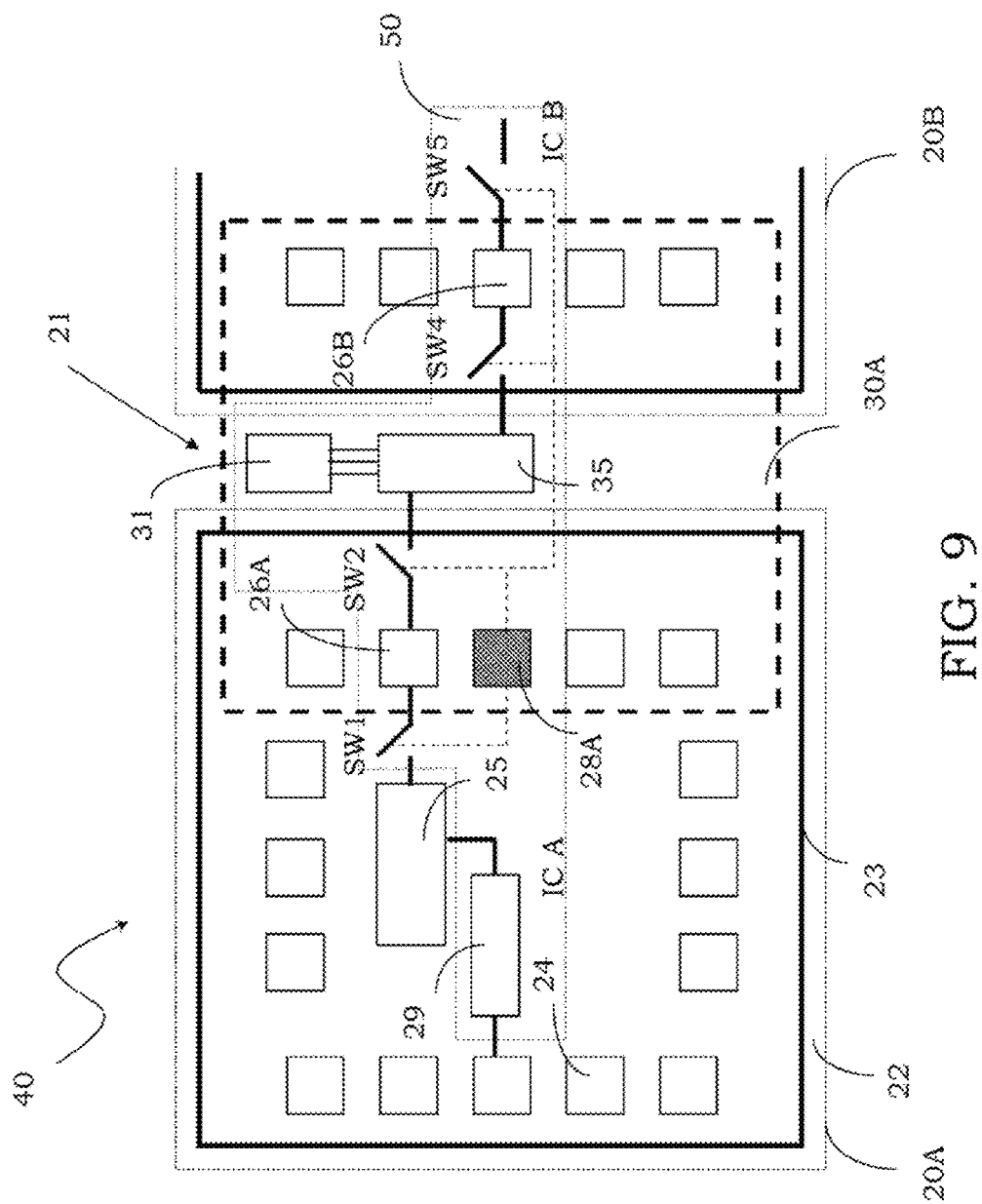
FIG. 9 schematically shows another embodiment of the architecture of FIG. 4.

According to another embodiment, the testing architecture 50 includes test circuits associated with circuit IC 25 of the integrated circuits 20A and 20B, and/or the circuit TEG 35 of the scribe line 21. In particular, as schematically shown in FIG. 9, a test circuit IC 29 is realized in the first integrated circuit 20A and coupled to the circuit IC 25, and a test circuit TEG 31 is realized in the scribe line 21 and coupled to the circuit TEG 35. In an embodiment, the test circuits IC 29 and TEG 31 are of the BIST (Built-In Self Test) type.

Figure 10:
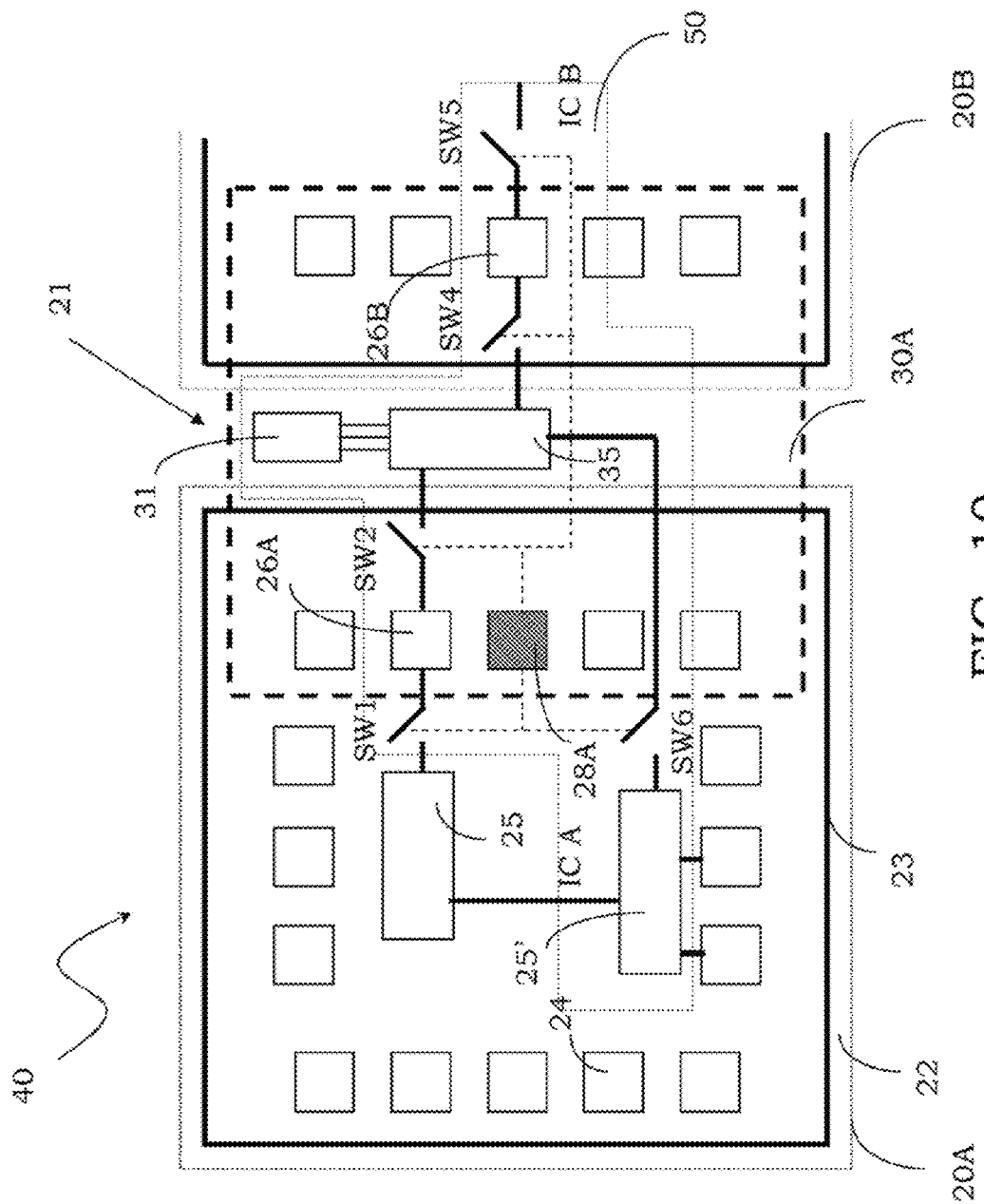
FIGS. 10-11 schematically show further embodiments of the architecture of FIG. 4.

Furthermore, according to an embodiment, schematically shown in FIG. 10, the testing architecture 50 may further include, for example in the first integrated circuit 20A, support circuitry 25', suitably coupled to the circuit TEG 35. In particular, the support circuitry 25' includes circuits that are in the first integrated circuit 20A that may be used also for the testing besides for the final application. This support circuitry 25' is coupled to the circuit TEG 35 by means of a further switch SW6 being in the switching circuitry 30, suitably driven, for example, by the enable pad 28A.

This support circuitry 25' may include, for example, an ADC converter (Analog to Digital Converter) and/or a DAC converter (Digital to Analog Converter), useful, for example, for executing analog measures by using an ATE with mainly digital resources. Alternatively, this support circuitry 25' may include a communication interface.

Figure 11:
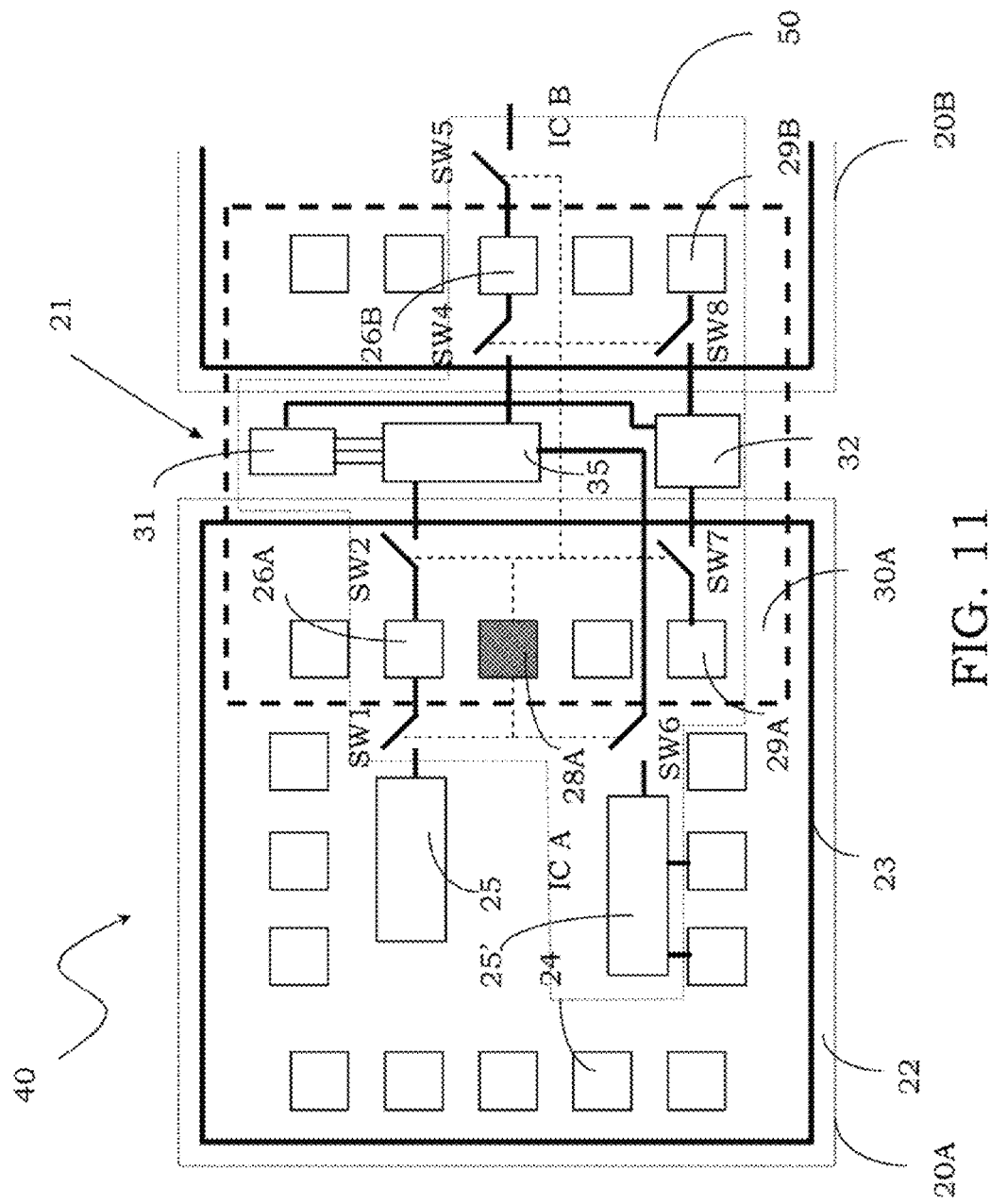

Finally, according to an alternative embodiment, the testing architecture 50 may also include a controller 32 coupled to the circuit TEG 35 or, like in the example shown in FIG. 11, to the test circuit TEG 31. The controller 32 supervises the testing of the various circuits TEG 35 acting also on the switches of coupling to the pad of the circuit IC 25 being in the switching circuitry 30 for possibly using circuits inside the integrated circuit 20A or 20B itself for possibly executing at least one test.

In an alternative embodiment, the controller 32 (that may be also indicated as TEG Test Controller or more in general as Test Controller) may be possibly used also for executing at least one test of the circuits inside at least one of the integrated circuits 20A and 20B.

As shown by way of indication in the figure, the testing architecture 50 also includes further pads, in particular the pads 29A and 29B realized in the first and second integrated circuits, 20A and 20B, and coupled to the controller 32, by means of respective switches SW7 and SW8 realized in the switching circuitry 30. The controller 32 is also coupled to the test circuit TEG 31. Also the switches SW7 and SW8 are suitably driven, for example by the enable pad 28A. In the example of the figure, the first integrated circuit 20A also includes the support circuitry 25' coupled, by means of the switch SW6, to the circuit TEG 35.

Thanks to the use of the controller 32 it is possible, for example, to execute the test of the circuits TEG 35 simultaneously to the test of the circuits IC 25.

Figure 12:
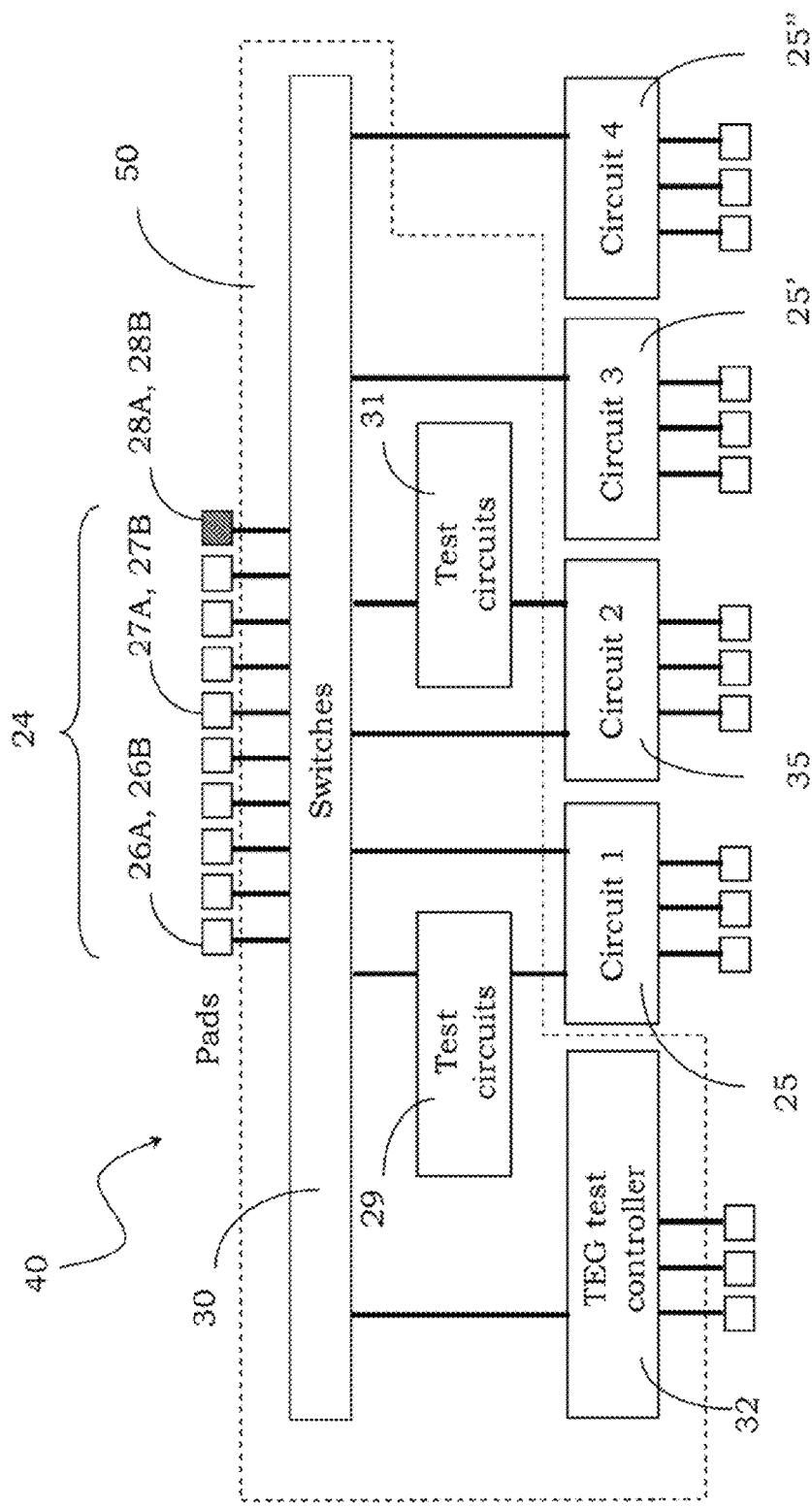
FIG. 12 shows a diagram relative to the architecture of FIG. 4.

In its more general form, schematically shown in FIG. 12, an embodiment relates to a wafer 40 including a plurality of integrated circuits, each including at least one inner circuit or circuit IC 25 to be tested. The wafer 40 also includes at least one testing architecture 50 in turn including at least one structure TEG realized in a scribe line providing separation between at least one pair of these integrated circuits, in turn including at least one inner circuit or circuit TEG 35.

According to an embodiment, the testing architecture 50 includes at least one switching circuit 30, coupled between the circuit IC 25 and/or the circuit TEG 35 and a plurality of pads 24 of the integrated circuits of the wafer 40. In particular, the switching circuitry 30 is coupled to the groups of pads 24A and 24B that form the integrated circuit TEG 30A, and more in particular to the pads, 26A, 26B, 27A, 27B and to the enable pads 28A, 28B.

The testing architecture 50 may also include test circuits for the integrated circuits and/or for the structures TEG. More in particular, as schematically shown in FIG. 12, the testing architecture 50 may include at least one test circuit IC 29 coupled to the circuit IC 25 and/or at least one test circuit TEG 31 coupled to the circuit TEG 35.

Furthermore, the testing architecture 50 may include a controller 32, coupled to the pads 24 by means of the switching circuitry 30.

The wafer 40 and/or the testing architecture 50 may further include inner circuitries, indicated with 25' and 25", that may be realized in the integrated circuits and/or in the scribe line and coupled in turn to the pads by means of the switching circuitry 30.

It is to be noted that, thanks to an embodiment of the testing architecture 50, at least one structure being in the scribe line may be used, also or exclusively, for the testing WLBI (Wafer Level Burn-In), in particular by using the pads of the integrated circuits coupled thereto for its suitable driving.

According to an embodiment, the integrated circuits 20A, 20B and also the integrated circuits TEG 30A may share structures and circuits, as well as have also their own dedicated circuits and structures, as explained in relation to the different embodiments previously described.

It is to be noted how the main shared structures of the testing architecture 50 concentrate:
inside the area where the seal ring 23 is realized, which can also be crossed by coupling lines
around the pads 24.

It is known that the seal ring 23 may include a plurality of metal layers (metal layers) and vias that couple them so as to realize a structure able to block also ions and polluting substances (such as for example humidity) that could jeopardize the good operation of the integrated circuits after the singulation of the wafer 40.

In its most general form, the testing architecture 50 is realized for an integrated circuit 20 including at least one conductive structure that extends in a peripheral portion 22 thereof on different planes starting from a substrate 37 of the wafer 40 and realizes the seal ring 23.

In particular, in this peripheral portion 22 a plurality of conductive lines 33 are realized, in particular metal lines, arranged on different planes starting from the substrate 37 to form the seal ring 23 that surrounds the integrated circuit 20 itself, as schematically shown in FIG. 13A, the planes being substantially parallel to the substrate 37 and developing in perpendicular starting therefrom in a vertical direction, considering the local reference of FIG. 13A. In particular, by way of illustration, the words "horizontal" and "vertical" will be used hereafter in the description for indicating development directions parallel to the substrate and perpendicular thereto, respectively, without these words being intended to limit the disclosure in any way.

In an embodiment of the seal ring 23, conductive lines 33 belonging to different planes are suitably coupled to each other by means of conductive couplings 36, for example conductive vias, that develop perpendicularly to these planes. In this way, a seal ring 23 is obtained having a structure substantially similar to a wall, starting from the substrate 37, as schematically shown in FIG. 13B.

In particular, the seal ring 23 may be reinforced with pillar structures 34 shown in FIG. 13C that may be used to form a pad 24 for the integrated circuit 20 and for the testing architecture 50 associated therewith, as it will be described hereafter.

Figures 14A, 14B:
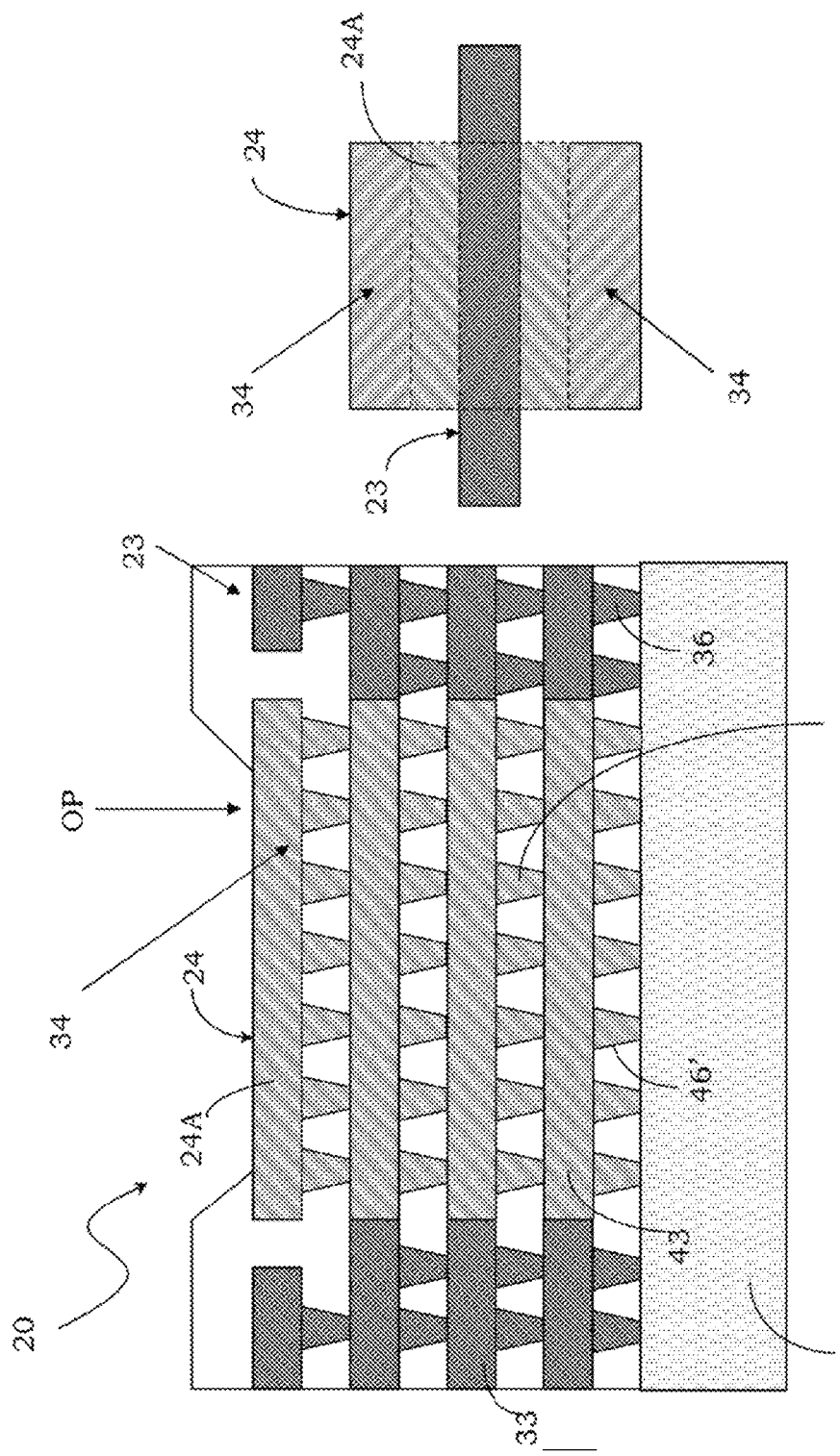
FIGS. 14A and 14B schematically show an embodiment of a pad of an integrated circuit provided with a seal ring to be used in an embodiment of the architecture of FIG. 4.
Figure 15:
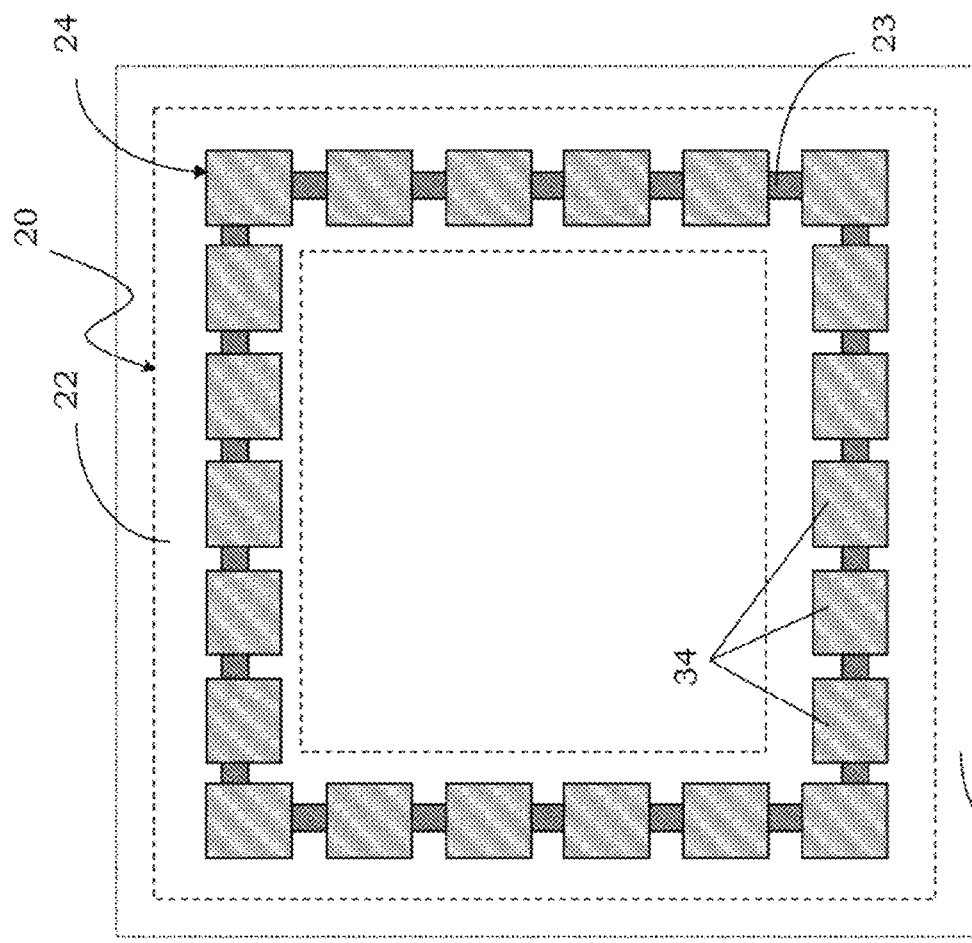
FIG. 15 schematically shows an integrated circuit provided with pad and seal ring as shown in FIGS. 14A and 14B and to be used in an embodiment of the architecture of FIG. 4.

More in particular, as schematically shown in FIG. 14A, each structure 34 that realizes a pad 24 is formed by a plurality of conductive lines 43 formed in the different planes and intercoupled to each other by conductive couplings 46. Suitable vias 46' are provided for the coupling to the substrate 37. In an alternative embodiment, not shown, the pillar structures 34 may be devoid of the vias 46' for coupling to the substrate 37. It is noted how the coupling between the conductive lines 43 by means of conductive vias 46 that realize the pad 24 strengthen the structure as a whole. In particular, in the case shown in the figure, the pillar structure 34 is also provided with an upper conductive line 24A emerging from the integrated circuit 20 through an opening OP so as to realize the pad 24. In the case shown in the figure, a further plurality of conductive lines 33 coupled by conductive vias 36 realizes the seal ring 23 around the integrated circuit 20.

According to another embodiment, the seal ring 23 includes linear elements, as schematically shown in the FIGS. 14A, 14B, 15 and 16. In this case, the linear element of the seal ring 23 crosses the pillar structures 34 of the pad 24, in particular below the upper conductive lines 24A.

Figure 16:
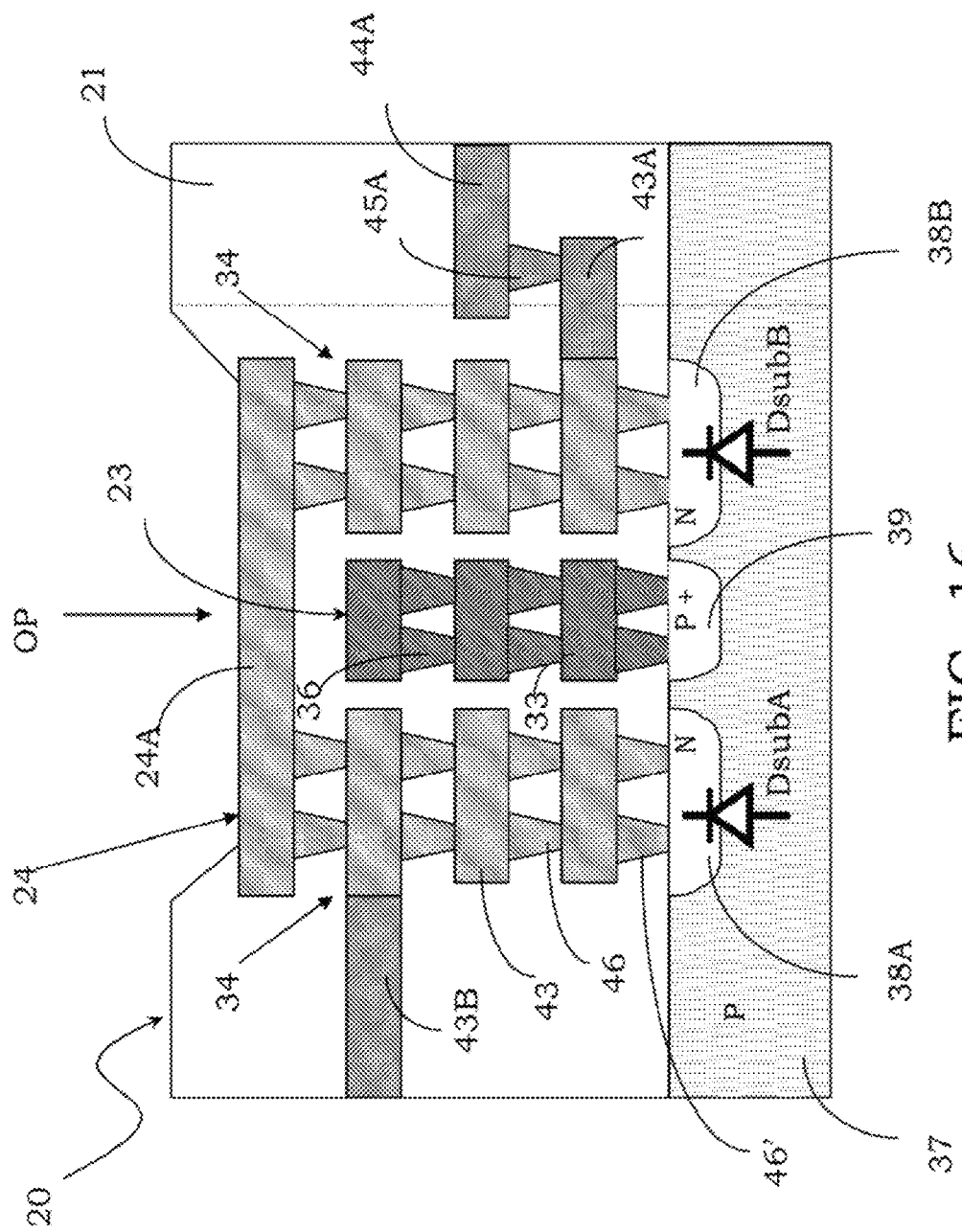
FIGS. 16, 17A, 17B, 18 and 19 schematically show details and embodiments of the pad and of the seal ring of FIGS. 14A and 14B.

In FIG. 16 wells 38A and 38B are schematically shown that form junctions PN in the substrate 37 in correspondence with the pillar structures 34, these pillar structures 34 being coupled to each other by means of an upper conductive line 33 so as to realize the pad 24. Moreover, a further well 39 may be realized below the seal ring 23, in turn including wall structures formed by the further conductive lines 33 suitably intercoupled to each other and to the further well 39 by means of vertical conductive couplings or vias 36.

In this way it is possible to insulate the pad 24 from the substrate 37 thanks to the presence of the junctions PN realized by the wells 38A and 38B. These junctions could be used also as a protection diode against the electrostatic discharges (ESD). These wells 38A and 38B are suitably doped in a complementary way with respect to the substrate 37 so as to form inversely biased junctions PN, indicated with DsubA and DsubB in the figure. In the case, for example, of a substrate 37 of the P type, the wells 38A and 38B will be suitably of the N type and in the case of a substrate 37 of the N type, the wells 38A and 38B will be of the P type.

Furthermore, thanks to the presence of the further well 39 below the seal ring 23, the same will have the possibility to be coupled or not to the substrate 37 according to the application. In the figure the further well 39 is doped in a similar way with respect to the substrate 37 and with a high doping for increasing its conductivity.

It is thus evident that, in this embodiment, a part of the pad 24 is formed inside the area surrounded by the seal ring 23, while a part of the pad is outside.

It is to be noted the fact that it is possible to further provide the presence of a hard material on the surface of the pad 24, in particular on its upper conductive line 24A emerging from the opening OP.

In substance, in this way a reinforced seal ring is obtained, having a similar shape as that of a castle with towers.

In another embodiment of the testing architecture 50, the pillar structures described for the generic pad 24 are used for realizing the coupling and/or enable pad of the testing architecture 50.

According to another embodiment, a pad 24 will possibly have at least suitable coupling lines between the inner and external parts of the pad with respect to the area delimited by the seal ring 23, in particular in the form of a first and a second coupling line, 43A and 43B. More in detail, the first coupling line 43A allows the coupling between the pad 24 and structures realized in the scribe line 21, for example structures TEG by means of a further metallization line 44A coupled to the first metallization line 43A by means of suitable vertical conductive couplings 45A, for example conductive vias, while the second coupling line 43B allows the coupling between the pad 24 and inner circuitry of the integrated circuit 20A. In this way, the pad thus realized may be used as a coupling pad of the testing architecture 50 according to an embodiment.

The pad 24 and the coupling lines 43A and 43B are insulated from the seal ring 23 itself, the pad 24 having a substantially ring-like shape that surrounds the seal ring 23.

In an alternative embodiment, not shown, if the pillar structures 34 are devoid of the coupling vias 46' to the substrate 37, the losses towards the substrate will be reduced, and in particular the leakage currents.

Figures 17A, 17B:
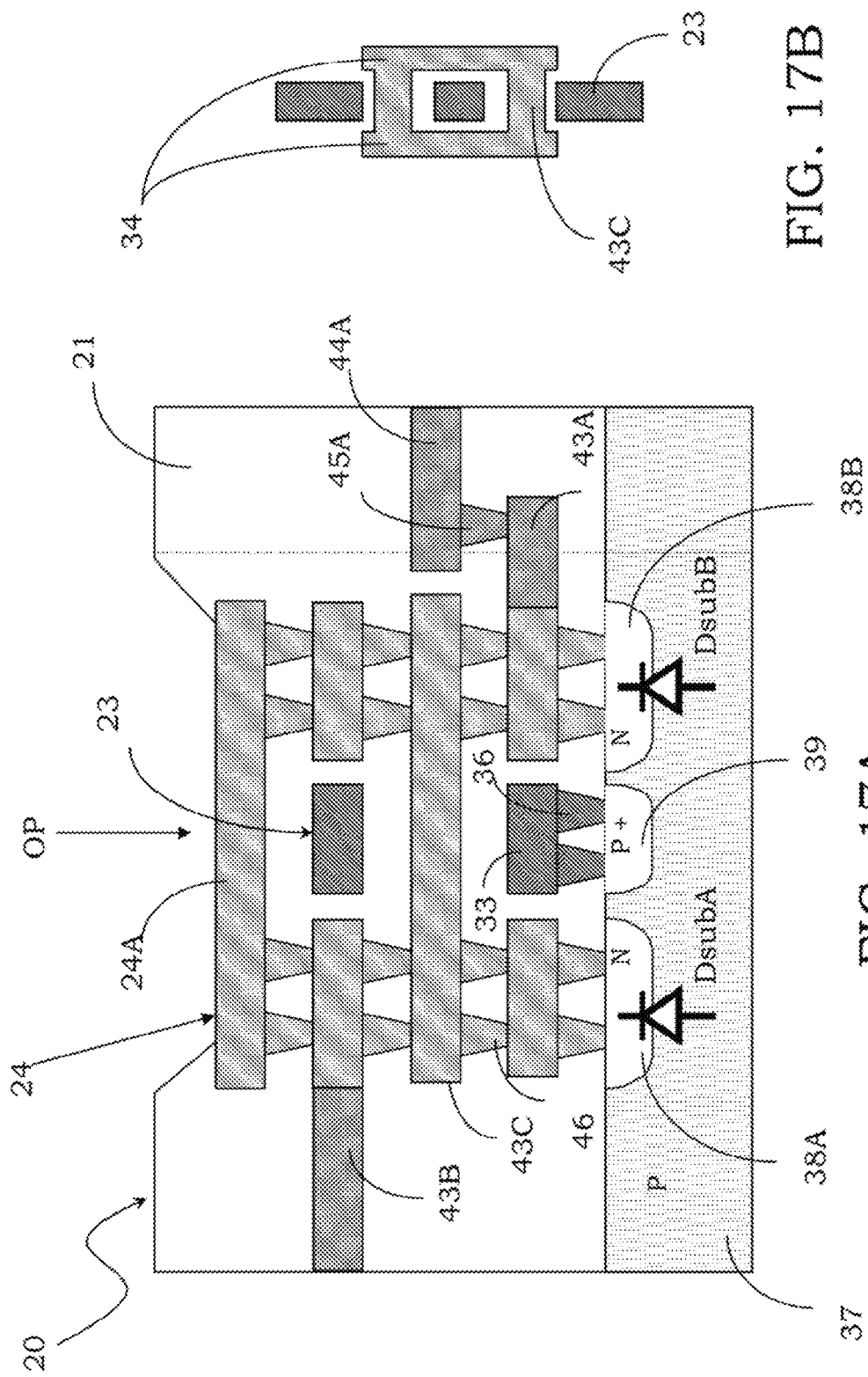

According to an alternative embodiment, schematically shown in the FIGS. 17A and 17B, the pillar structures 34 may be coupled to each other by means of further lines 43C.

The pad 24 could be thus coupled to circuits external to the integrated circuit 20A in such a way to avoid damages of the pad 24 itself further to lateral mechanical efforts due to the cut or singulation of the wafer 40, and in this sense vertical conductive couplings 45A will be possibly present in the form of a via that, subjected to mechanical effort during this cutting step, is uncoupled from one of the two conductive lines 43A and/or 44A that couple these external structures, for example structures TEG, to the pad 24.

Figure 18:
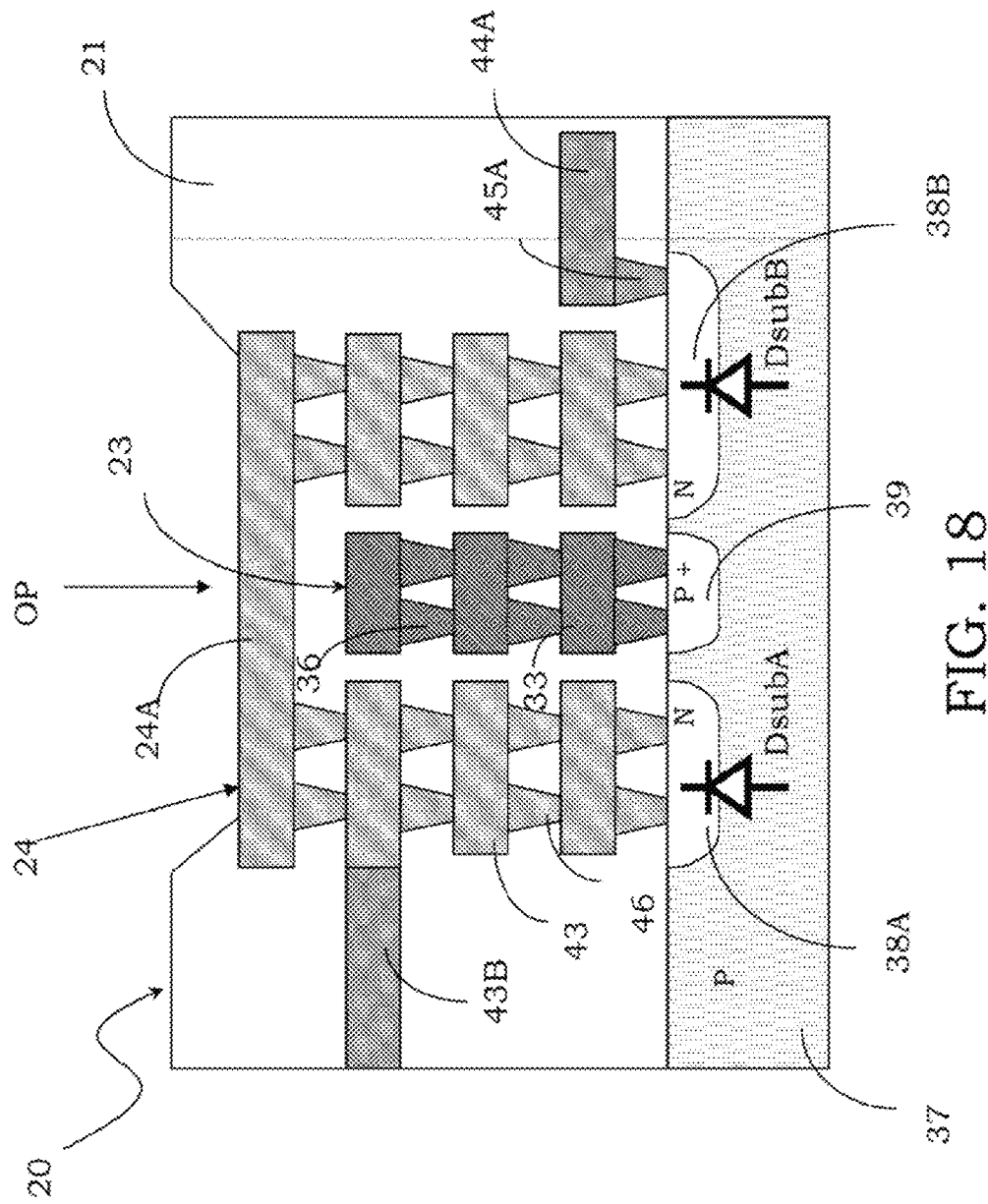

In a further alternative embodiment, schematically shown in FIG. 18, it is possible to couple these external structures, and in particular the further conductive line 44A, directly to the well 38B realized under the pad 24 in correspondence with the scribe line 21, in such a way to avoid the damage of the pad 24.

Figure 19:
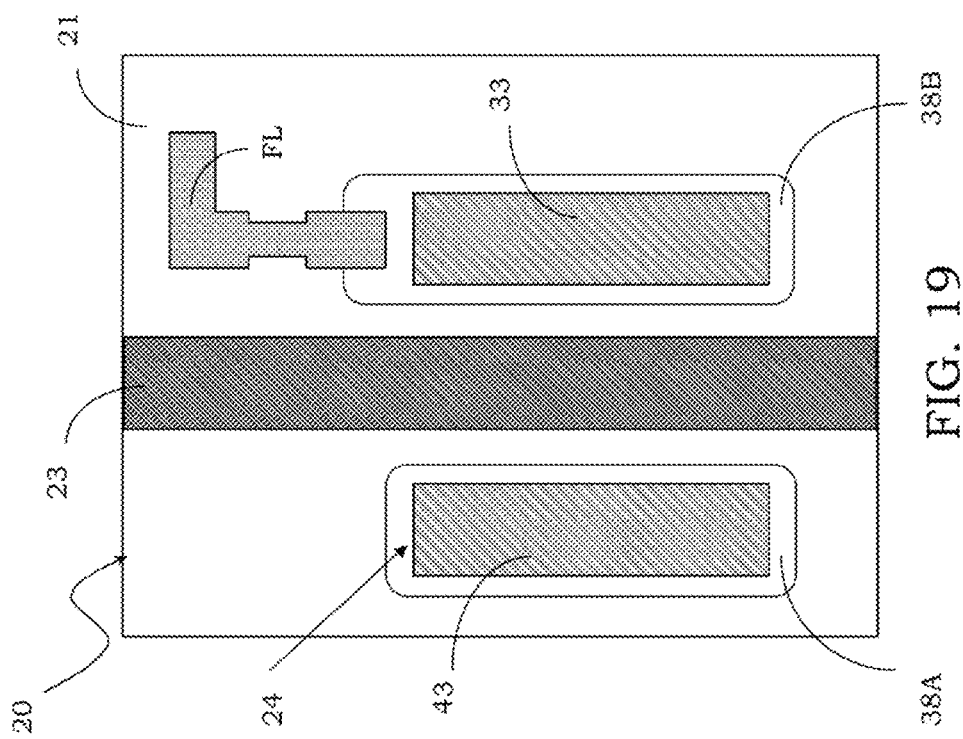

According to an embodiment, it is also possible to obtain a fuse link FL providing coupling between the pad 24 and external circuitry, if any, such as the structures TEG by simply tapering off a coupling line, in particular a metallization line, as shown in FIG. 19, this fuse link FL having a development being substantially parallel to the seal ring 23 so as to save space. This fuse link may be compressed in the testing architecture 50 according to an embodiment, in particular in its switching circuitry 30.

Figure 20:
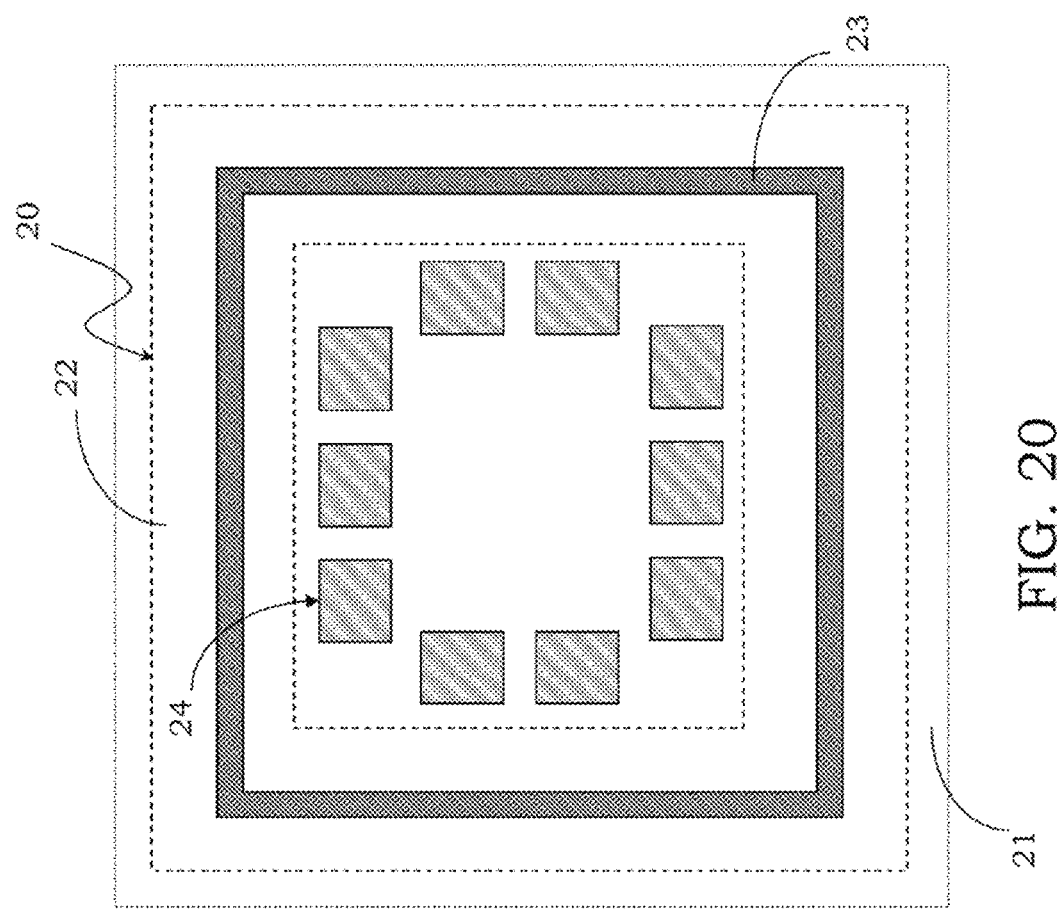
FIG. 20 schematically shows another embodiment of a pad of an integrated circuit provided with a seal ring to be used in an embodiment of the architecture of FIG. 4.

In a second embodiment of the seal ring 23, schematically shown in FIG. 20, the pads 24 are realized inside the seal ring 23 that surrounds the integrated circuit 20A in a traditional way.

Figure 21:
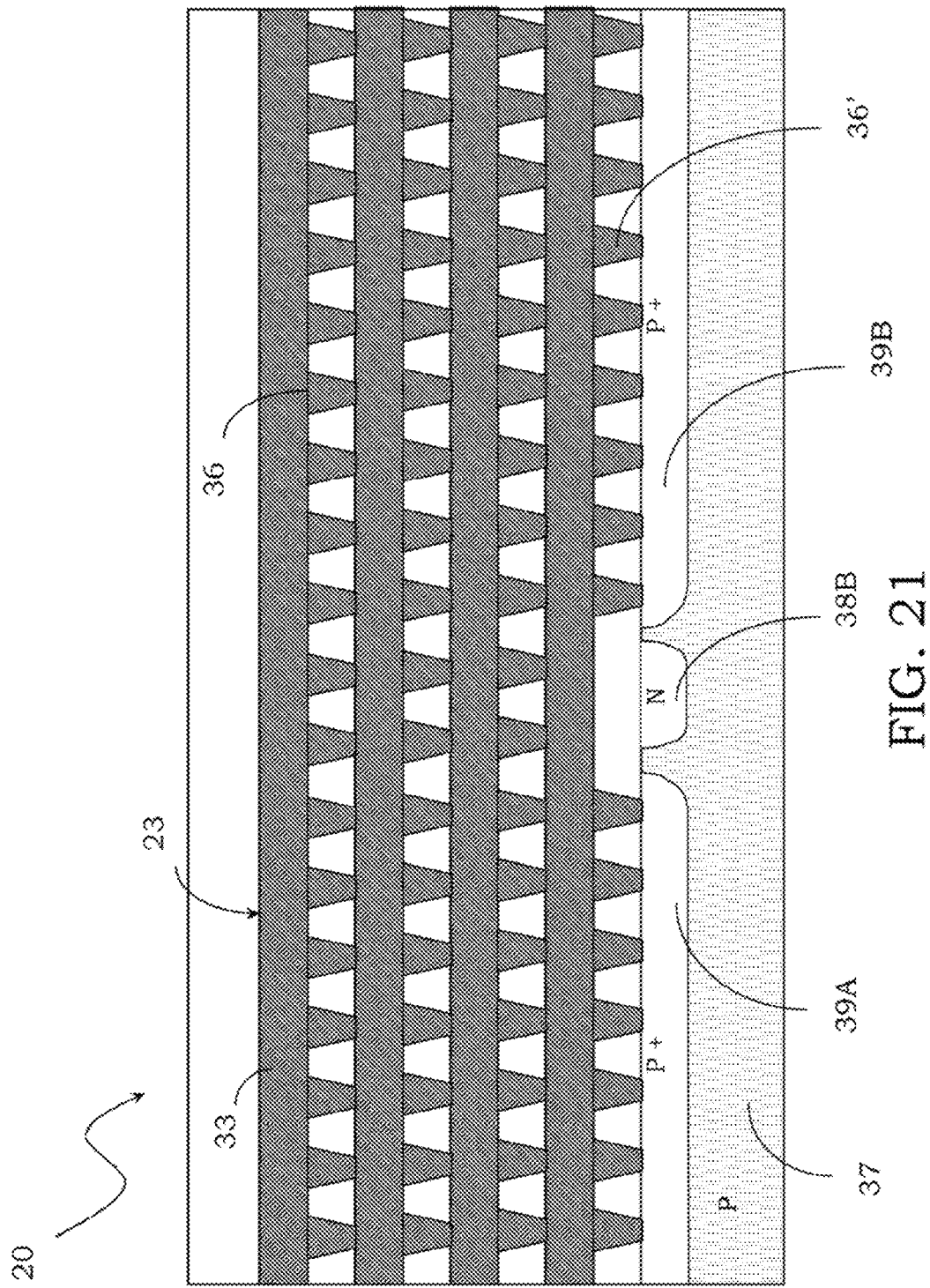
FIGS. 21, 22A, 22B and 23 schematically show embodiments and details of the pad and of the seal ring of FIG. 20.

According to an embodiment, for coupling the pad 24 to circuits external to the integrated circuit 20A, the seal ring 23 is crossed in a simple way by means of a well 38B doped in an opposite way with respect to the substrate 37, and in particular in the exemplifying case of a substrate of the P type, the well 38B will be of the N type. More in particular, this well 38B is not coupled to the seal ring 23, in turn formed by means of a plurality of conductive lines 33 intercoupled by means of vertical conductive couplings 36 in a wall-like structure, as schematically shown in FIG. 21. It is noted that the wall-like structure of the seal ring 23 allows to avoid the creation of contacts and/or vias that couple it to this well 38B, its lower vertical conductive couplings 36', i.e. for the coupling to the substrate 37 indeed, being suitably absent in correspondence with this well 38B.

The seal ring 23 according to the application could be coupled to the substrate 37 or insulated therefrom thanks to the presence of the wells 39A and 39B, as shown in FIG. 21.

Figure 22B:
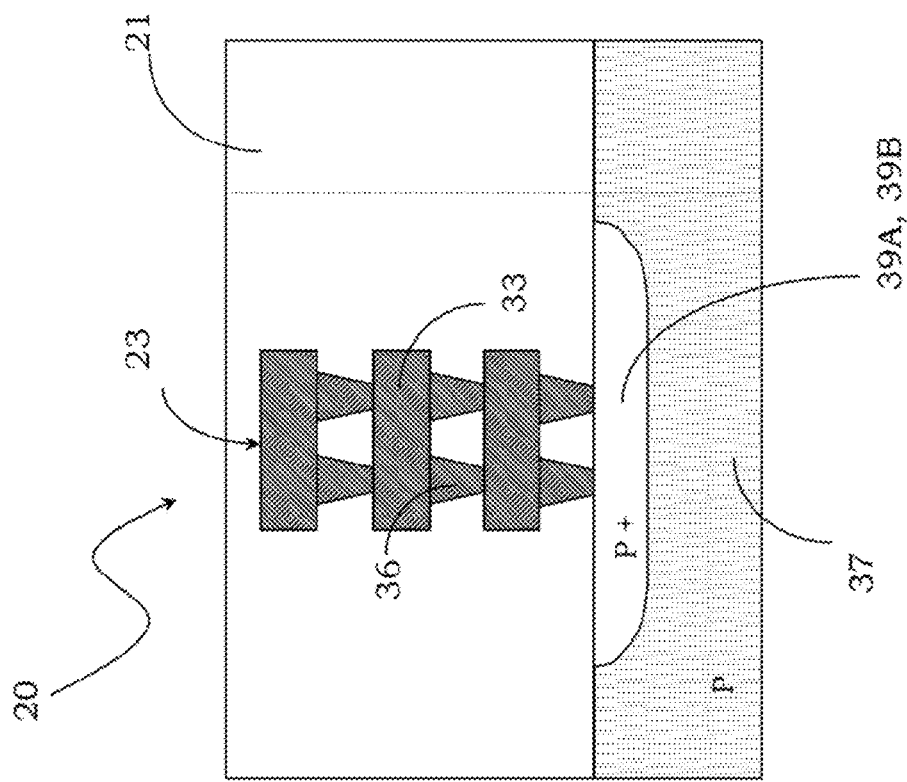
Figure 22A:
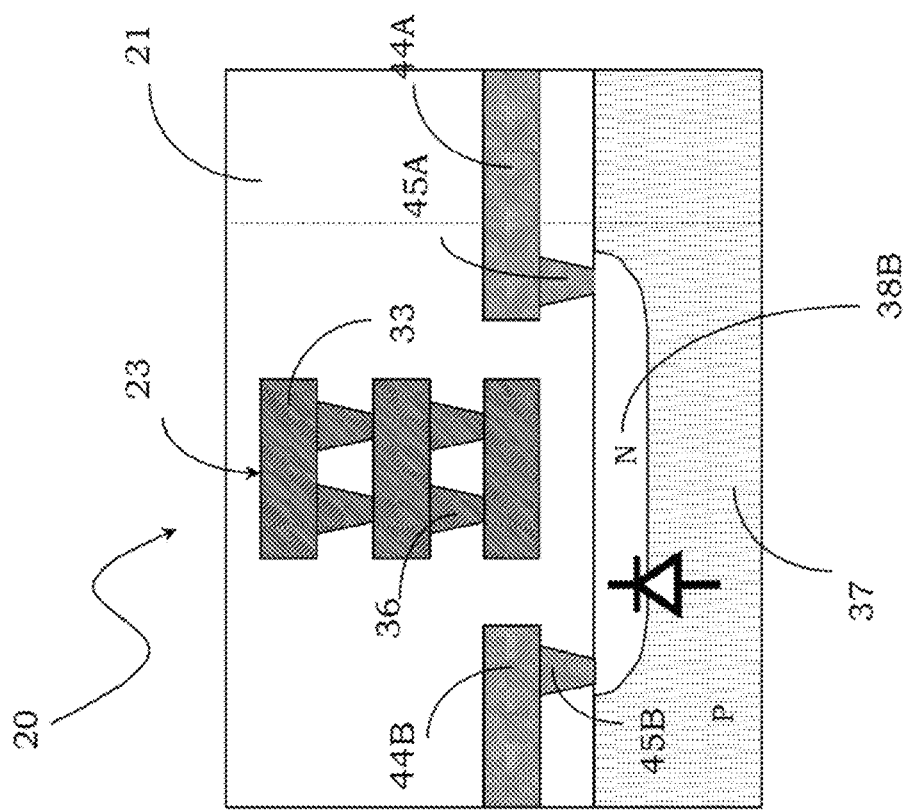
Figure 23:
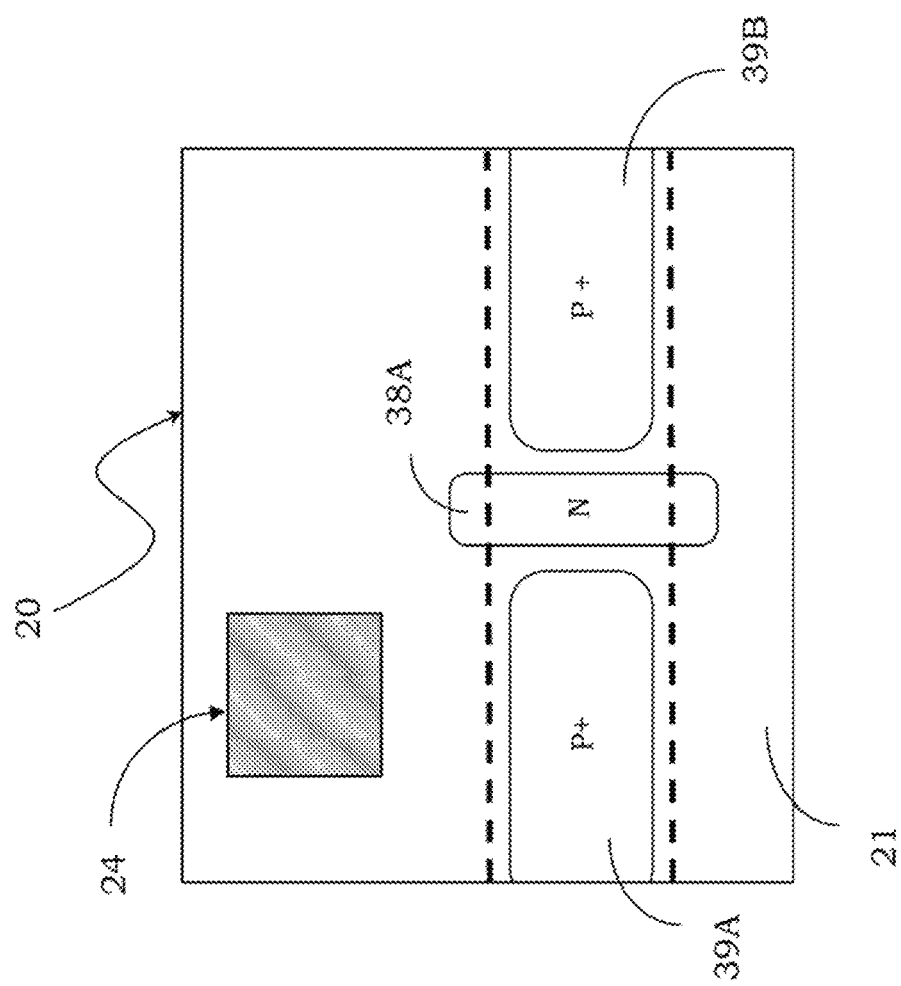

More in particular, as shown in FIGS. 22A and 22B, the integrated circuit 20 includes a wall-like structure of the seal ring 23 realized in correspondence with and in contact with the wells 39A and 39B, while the same is insulated from the well 38B, whereto, instead, the conductive lines 44A and 44B are coupled, by means of respective vertical conductive couplings 45A and 45B, for the coupling of the pad 24 or of the inner circuits of the integrated circuit 20A, respectively, to circuits external to the integrated circuit 20A, this coupling being realized by the well 38B. A view from above of the substrate including the wells 38B, 39A and 39B as well as at least one pad 24 is given by way of example in FIG. 23.

In conclusion, the testing architecture 50 of the integrated circuits on wafer realized according to an embodiment includes at least one switching circuitry and is able to execute the testing of the structures TEG in a reliable way, avoiding to put pads of high hardness materials in the scribe line providing separation between the integrated circuits of the wafer itself, these pads possibly introducing, as previously seen in relation to the prior art, problems during the cutting or singulation step of the wafer. In particular, according to an embodiment, the testing architecture allows to avoid the chipping of the integrated circuits further to the cut of the wafer, thus improving the quality of the final product.

In particular, according to an embodiment, the testing architecture allows to execute the testing of the structures TEG and of the integrated circuits realized on the wafer, so that the presence of the ones does not jeopardize the measures and the test on the others and vice versa. More in particular, the testing architecture according to an embodiment may also include at least one plurality of pads shared by at least one inner circuitry of the integrated circuits on the wafer and at least one circuitry relative to the structures TEG realized in the scribe line.

Further according to an embodiment, the testing circuitry embedded in the integrated circuits on the wafer is able to correctly operate when there is a protection seal ring realized around each of these integrated circuits.

According to an embodiment, the testing architecture as proposed allows to make the circuits inside the area delimited by the seal ring cooperate with circuits external of the same, so as to further simplify the test and measures executed on the integrated circuits of the wafer. These advantages are attained with simple modifications of the seal ring by adding pillar structures.

According to a further embodiment, thanks to the testing architecture, inside a same test flow it is possible to execute both the test EWS of the integrated circuits and the test of the structures TEG, besides possible structures for the testing WLBI.

An embodiment also allows to reinforce the seal ring. Furthermore, the scribe line being devoid of pads, it is possible, in case, to reduce the width of the scribe line itself in conformity with the requisites necessary for the cut of the wafer.

A first integrated circuit sliced from such a wafer per an embodiment above may be part of a system that includes at least one other integrated circuit coupled to the first integrated circuit. The integrated circuits may be disposed on a same die or on respective dies, and one of the integrated circuits may include a controller such as a processor.

From the foregoing it will be appreciated that, although specific embodiments have been described herein for purposes of illustration, various modifications may be made without deviating from the spirit and scope of the disclosure. Furthermore, where an alternative is disclosed for a particular embodiment, this alternative may also apply to other embodiments even if not specifically stated.

The invention claimed is:

1. A wafer, comprising:
   a first integrated-circuit die;
   a scribe line adjacent to the first integrated-circuit die;
   a testing circuit disposed in the scribe line;
   a first contact pad disposed in the first integrated-circuit die;
   a second contact pad disposed in the first integrated-circuit die; and
   a first switch element disposed in the first integrated-circuit die and having a first node coupled to the testing circuit and having a second node coupled to the first contact pad and having a control node directly connected to the second contact pad,
   wherein an open and closed state of the first switch for selectively connecting the testing circuit and the first contact pad is changeable during execution of a test solely in response to changing a control signal applied to the second contact pad.

2. The wafer of claim 1 wherein the testing circuit forms part of a test element group.

3. The wafer of claim 1, further comprising:
   a circuit element disposed in the first integrated-circuit die; and
   a second switch element disposed in the first integrated-circuit die and having a first node coupled to the circuit element and having a second node coupled to the first contact pad and having a control node directly connected to the second contact pad,
   wherein an open and closed state of the second switch for selectively connecting the circuit element and the testing circuit is changeable during execution of said test solely in response to changing the control signal applied to the second contact pad.

4. The wafer of claim 1, further comprising:
   a second integrated-circuit die adjacent to the scribe line;
   a third contact pad disposed in the second integrated-circuit die; and
   a second switch element disposed in the second integrated-circuit die and having a first node coupled to the testing circuit and having a second node coupled to the third contact pad and having a control node directly connected to the second contact pad,
   wherein an open and closed state of the second switch for selectively connecting the third contact pad and the testing circuit is changeable during execution of said test solely in response to changing the control signal applied to the second contact pad.

5. The wafer of claim 1, further comprising:
   a second integrated-circuit die adjacent to the scribe line;
   a third contact pad disposed in the second integrated-circuit die;
   a circuit element disposed in the second integrated-circuit die;
   a second switch element disposed in the second integrated-circuit die and having a first node coupled to the testing circuit and having a second node coupled to the third contact pad and having a control node directly connected to the second contact pad; and
   a third switch element disposed in the second integrated-circuit die and having a first node coupled to the circuit element and having a second node coupled to the third contact pad and having a control node directly connected to the second contact pad,
   wherein an open and closed state of the second and third switches for selectively connecting is changeable during execution of said test solely in response to changing the control signal applied to the second contact pad.

6. The wafer of claim 1, further comprising:
   a circuit element disposed on the first integrated-circuit die; and a second switch element disposed on the first integrated-circuit die and having a first node coupled to the test circuit and having a second node coupled to the circuit element and having a control node directly connected to the second contact pad, wherein an open and closed state of the second switch for selectively connecting the circuit element and the testing circuit is changeable during execution of said test solely in response to changing the control signal applied to the second contact pad.

7. The wafer of claim 1, further comprising:

a control circuit disposed in the scribe line and coupled to the testing circuit;

a third contact pad disposed in the first integrated-circuit die; and a second switch element having a first node coupled to the third contact pad and having a second node coupled to the control circuit and having a control node directly connected to the second contact pad, wherein an open and closed state of the second switch for selectively connecting the third contact pad and the control circuit is changeable during execution of said test solely in response to changing the control signal applied to the second contact pad.

8. An integrated circuit, comprising:

an edge region at a scribe line;

a first conductive path extending to the edge region;

a first contact pad;

a second contact pad; and a first switch element having a first node coupled to the first conductive path and having a second node coupled to the first contact pad and having a control node directly connected to the second contact pad, wherein an open and closed state of the first switch for selectively connecting the first contact pad and the first conductive path is changeable during execution of said test solely in response to changing a control signal applied to the second contact pad.

9. The integrated circuit of claim 8, further comprising:

a circuit element; and a second switch element having a first node coupled to the circuit element and having a second node coupled to the first contact pad and having a control node directly connected to the second contact pad, wherein an open and closed state of the second switch for selectively connecting the first contact pad and the circuit element is changeable during execution of said test solely in response to changing the control signal applied to the second contact pad.

10. The integrated circuit of claim 8, further comprising:

a second conductive path extending to the edge region; and a circuit element coupled to the second conductive path.

11. The integrated circuit of claim 8, further comprising:

a seal ring disposed in the edge region; and wherein the first and second contact pads are disposed inside of a region bounded by the seal ring.

12. The integrated circuit of claim 8, further comprising:

a seal ring disposed in the edge region; and wherein the first and second contact pads are disposed in the seal ring.

13. The integrated circuit of claim 8, further comprising:

a seal ring disposed in the edge region; and wherein at least one of the first and second contact pads forms part of the seal ring.

14. The integrated circuit of claim 8, further comprising a substrate having a doped portion that forms part of the first conductive path.

\* \* \* \* \*